(12) United States Patent
Tseng et al.

(10) Patent No.: US 10,171,034 B2
(45) Date of Patent: Jan. 1, 2019

(54) PHASE-ROTATED HARMONIC-REJECTION MIXER APPARATUS

(71) Applicant: MEDIATEK INC., Hsin-Chu (TW)

(72) Inventors: Chien-Wei Tseng, Keelung (TW); Ian Tseng, Taipei (TW); Ming-Da Tsai, Miaoli County (TW); Yangjian Chen, Kings Hill (GB); Chien-Cheng Lin, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/462,923

(22) Filed: Mar. 20, 2017

(65) Prior Publication Data

US 2017/0294878 A1 Oct. 12, 2017

Related U.S. Application Data

(60) Provisional application No. 62/319,930, filed on Apr. 8, 2016.

(51) Int. Cl.
*H03D 7/12* (2006.01)
*H03D 7/16* (2006.01)

(52) U.S. Cl.
CPC ............... *H03D 7/12* (2013.01); *H03D 7/165* (2013.01); *H03D 2200/0082* (2013.01)

(58) Field of Classification Search
CPC .... H03D 7/165; H03D 7/1483; H03D 7/1475; H03D 7/12; H03D 7/163
USPC .... 455/323, 326, 209, 318, 333, 315, 189.1, 455/147, 114.2, 255, 550.1, 403, 422.1
See application file for complete search history.

(56) References Cited

U.S. PATENT DOCUMENTS

| 4,457,022 | A | 6/1984 | Dydyk |
| 5,214,796 | A | 5/1993 | Gorrie |
| 6,560,297 | B1 | 5/2003 | Broughton |
| 6,631,256 | B2 | 10/2003 | Suominen |
| 6,766,158 | B1 | 7/2004 | Molnar |
| 7,130,604 | B1 | 10/2006 | Wong |

(Continued)

FOREIGN PATENT DOCUMENTS

| EP | 1 424 769 A1 | 6/2004 | |
| EP | 2360835 A1 * | 8/2011 | ............. H03D 7/165 |

(Continued)

OTHER PUBLICATIONS

Chen, An LTE SAW-Less Transmitter Using 33% Duty-Cycle LO Signals for Harmonic Suppression, pp. 172-173 and a page including Figure 9.7.7, ISSCC 2015/Session 9/High-Performance Wireless/9.7.

(Continued)

*Primary Examiner* — Keith Ferguson
(74) *Attorney, Agent, or Firm* — Winston Hsu

(57) ABSTRACT

A harmonic-rejection mixer apparatus includes a mixing circuit and a combining circuit. The mixing circuit receives mixes an input signal and a first local oscillator (LO) signal to generate a first output signal, and mixes the same input signal and a second LO signal to generate a second output signal, wherein the first LO signal and the second LO signal have a same frequency but different phases. The combining circuit combines the first output signal and the second output signal, wherein harmonic rejection is at least achieved by combination of the first output signal and the second output signal.

23 Claims, 15 Drawing Sheets

(56) References Cited

U.S. PATENT DOCUMENTS

| | | |
|---|---|---|
| 7,299,025 B1 | 11/2007 | Wong |
| 8,114,600 B2 | 2/2012 | Brennan |
| 8,260,223 B2 | 9/2012 | He |
| 8,660,508 B2 | 2/2014 | Jeurissen |
| 8,670,739 B1 | 3/2014 | Murphy |
| 9,071,197 B2 | 6/2015 | Vora |
| 9,628,308 B2 | 4/2017 | Muhammad |
| 9,692,464 B1 | 6/2017 | Cheng |
| 10,009,050 B2 | 6/2018 | Chen |
| 2002/0055337 A1 | 5/2002 | Persico |
| 2004/0106380 A1 | 6/2004 | Vassiliou |
| 2006/0205370 A1 | 9/2006 | Hayashi |
| 2008/0113628 A1 | 5/2008 | Muhammad |
| 2009/0315611 A1 | 12/2009 | Lu |
| 2009/0325510 A1 | 12/2009 | Pullela |
| 2010/0156502 A1 | 6/2010 | Van Zeijl |
| 2011/0136460 A1* | 6/2011 | Cho ............... H03D 7/165 455/302 |
| 2011/0217940 A1 | 9/2011 | Oliaei |
| 2011/0279164 A1 | 11/2011 | Shimizu |
| 2012/0064850 A1* | 3/2012 | Matsui ............ H03D 7/165 455/131 |
| 2012/0263215 A1 | 10/2012 | Peng |
| 2012/0328041 A1 | 12/2012 | Chen |
| 2013/0003890 A1 | 1/2013 | Schwent |
| 2013/0059556 A1 | 3/2013 | Molnar |
| 2013/0115907 A1 | 5/2013 | Theodoratos |
| 2013/0169342 A1 | 7/2013 | Cho |
| 2013/0257508 A1 | 10/2013 | Goel |
| 2014/0018014 A1 | 1/2014 | Modha |
| 2014/0018123 A1 | 1/2014 | Frank |
| 2014/0155013 A1 | 6/2014 | Murphy |
| 2014/0169237 A1 | 6/2014 | Furuta |
| 2014/0176217 A1* | 6/2014 | Lin ............... H03D 7/165 327/298 |
| 2014/0364076 A1 | 12/2014 | Cha |
| 2015/0030105 A1 | 1/2015 | Vora |
| 2015/0094004 A1 | 4/2015 | Vora |
| 2016/0127160 A1 | 5/2016 | Muhammad |
| 2016/0164464 A1* | 6/2016 | Sun ............... H03K 5/00006 327/115 |
| 2017/0141737 A1 | 5/2017 | Seth |
| 2017/0180181 A1 | 6/2017 | Chen |

FOREIGN PATENT DOCUMENTS

| | | |
|---|---|---|
| JP | 2003198329 A | 7/2003 |
| WO | 2015/135507 A1 | 9/2015 |

OTHER PUBLICATIONS

Ingels, A Multiband 40nm CMOS LTE SAW-Less Modulator with—60dBc C-IM3, pp. 338-339 and a page including Figure 19.6.7, ISSCC 2013/Session 19/Wireless Transceivers for Smart Devices/19.6.

Weldon, A 1.75-GHz Highly Integrated Narrow-Band CMOS Transmitter With Harmonic-Rejection Mixers, IEEE Journal of Solid-State Circuits, vol. 36, No. 12, pp. 2003-2015, Dec. 2001.

* cited by examiner

PHASE-ROTATED HARMONIC-REJECTION MIXER APPARATUS

CROSS REFERENCE TO RELATED APPLICATIONS

This application claims the benefit of U.S. provisional application No. 62/319,930, filed on Apr. 8, 2016 and incorporated herein by reference.

BACKGROUND

The present invention relates to a harmonic rejection design, and more particularly, to a phase-rotated harmonic-rejection mixer apparatus.

Increasing demand for transceiver devices with small form factors has motivated research on highly integrated low-cost transmitter and receiver circuits. For example, direct conversion transmitter (TX) and receiver (RX) circuits can simplify the signal path by using one up-conversion mixer to translate a baseband (BB) signal to a radio-frequency (RF) signal through a local oscillator (LO) signal and using one down-conversion mixer to translate an RF signal to a BB signal through an LO signal. However, due to the increasing demand for a larger signal bandwidth, the counter intermodulation products (CIM) become important in the transceiver design, especially the $3^{rd}$-order counter intermodulation product $CIM_3$. One contributor to $CIM_3$ (e.g., LO-3BB) comes from the baseband $3^{rd}$-order nonlinearity. For example, in the TX mixer, the $3^{rd}$ harmonic of the baseband signal (i.e., 3BB) is up-converted to LO-3BB. Another contributor to $CIM_3$ comes from the mixer, where up-conversion with the $3^{rd}$ harmonic of the LO signal (i.e., 3LO) creates a signal component at 3LO-BB that can generate $CIM_3$ (e.g., LO-3BB) due to intermodulation with a wanted signal (e.g., LO+BB) in a nonlinear amplifier. Hence, there is a need for an innovative mixer design which can effectively mitigate or cancel the undesired counter intermodulation products, especially the $3^{rd}$-order counter intermodulation product $CIM_3$.

SUMMARY

One of the objectives of the claimed invention is to provide a phase-rotated harmonic-rejection mixer apparatus.

According to a first aspect of the present invention, an exemplary harmonic-rejection mixer apparatus is disclosed. The exemplary harmonic-rejection mixer apparatus includes a mixing circuit and a combining circuit. The mixing circuit is configured to receive an input signal, a first local oscillator (LO) signal and a second LO signal, and further configured to mix the same input signal and the first LO signal to generate a first output signal and mix the same input signal and the second LO signal to generate a second output signal, wherein the first LO signal and the second LO signal have a same frequency but different phases. The combining circuit is configured to combine the first output signal and the second output signal, wherein harmonic rejection is at least achieved by combination of the first output signal and the second output signal.

According to a second aspect of the present invention, an exemplary harmonic-rejection mixer apparatus is disclosed. The exemplary harmonic-rejection mixer apparatus includes a mixing circuit and a combining circuit. The mixing circuit is configured to receive a first input signal, a second input signal, and a local oscillator (LO) signal, and further configured to mix the first input signal and the LO signal to generate a first output signal and mix the second input signal and the LO signal to generate a second output signal, wherein the first input signal and the second input signal have a same peak amplitude but difference phases. The combining circuit is configured to combine the first output signal and the second output signal, wherein harmonic rejection is at least achieved by combination of the first output signal and the second output signal.

According to a third aspect of the present invention, an exemplary harmonic-rejection mixer apparatus is disclosed. The exemplary harmonic-rejection mixer apparatus includes a mixing circuit and a combining circuit. The mixing circuit is configured to receive a first input signal, a second input signal, a first local oscillator (LO) signal and a second LO signal, and further configured to mix the first input signal and the first LO signal to generate a first output signal and mix the second input signal and the second LO signal to generate a second output signal, wherein the first input signal and the second input signal have a same peak amplitude but difference phases, and the first LO signal and the second LO signal have a same frequency but different phases. The combining circuit is configured to combine the first output signal and the second output signal, wherein harmonic rejection is at least achieved by combination of the first output signal and the second output signal.

According to a fourth aspect of the present invention, an exemplary harmonic-rejection mixer apparatus is disclosed. The exemplary harmonic-rejection mixer apparatus includes a first transistor and a second transistor. The first transistor has a control node configured to receive a first local oscillator (LO) signal, a first connection node configured to receive an input signal, and a second connection node configured to generate a first output signal to an interconnection node. The second transistor has a control node configured to receive a second LO signal, a first connection node configured to receive the same input signal, and a second connection node configured to generate a second output signal to the interconnection node, wherein the first LO signal and the second LO signal have a same frequency but different phases, and harmonic rejection is at least achieved by combination of the first output signal and the second output signal at the interconnection node.

According to a fifth aspect of the present invention, an exemplary harmonic-rejection mixer apparatus is disclosed. The exemplary harmonic-rejection mixer apparatus includes a first transistor and a second transistor. The first transistor has a control node configured to receive a local oscillator (LO) signal, a first connection node configured to receive a first input signal, and a second connection node configured to generate a first output signal to an interconnection node. The second transistor has a control node configured to receive the same LO signal, a first connection node configured to receive a second input signal, and a second connection node configured to generate a second output signal to the interconnection node, wherein the first input signal and the second input signal have a same peak amplitude but difference phases, and harmonic rejection is at least achieved by combination of the first output signal and the second output signal at the interconnection node.

According to a sixth aspect of the present invention, an exemplary harmonic-rejection mixer apparatus is disclosed. The exemplary harmonic-rejection mixer apparatus includes a first transistor and a second transistor. The first transistor has a control node configured to receive a first local oscillator (LO) signal, a first connection node configured to receive a first input signal, and a second connection configured to generate a first output signal to an interconnection node. The second transistor has a control node configured to receive a second LO signal, a first connection node configured to receive a second input signal, and a second connection node configured to generate a second output signal to the interconnection node, wherein the first LO signal and the second LO signal have a same frequency but different phases, the first input signal and the second input signal have a same peak amplitude but difference phases, and harmonic rejection is at least achieved by combination of the first output signal and the second output signal at the interconnection node.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

As mentioned above, $CIM_3$ (e.g., LO-3BB) originated from harmonic mixing of $3^{rd}$-order harmonic of the baseband signal (3BB) and harmonic mixing of $3^{rd}$-order harmonic of the LO signal (3LO). Hence, by cancelling or suppressing 3LO and/or 3BB, the $CIM_3$ level can be effectively lowered. The present invention proposes a phase-rotated harmonic rejection mixer design which employs a vector-sum scheme to achieve the desired harmonic cancellation, especially the harmonic cancellation of 3BB and/or 3LO. In addition, the proposed phase-rotated harmonic rejection mixer design may employ a particular LO duty cycle for achieving additional harmonic suppression. Further details of the proposed phase-rotated harmonic rejection mixer design are described as below.

Figure 1:
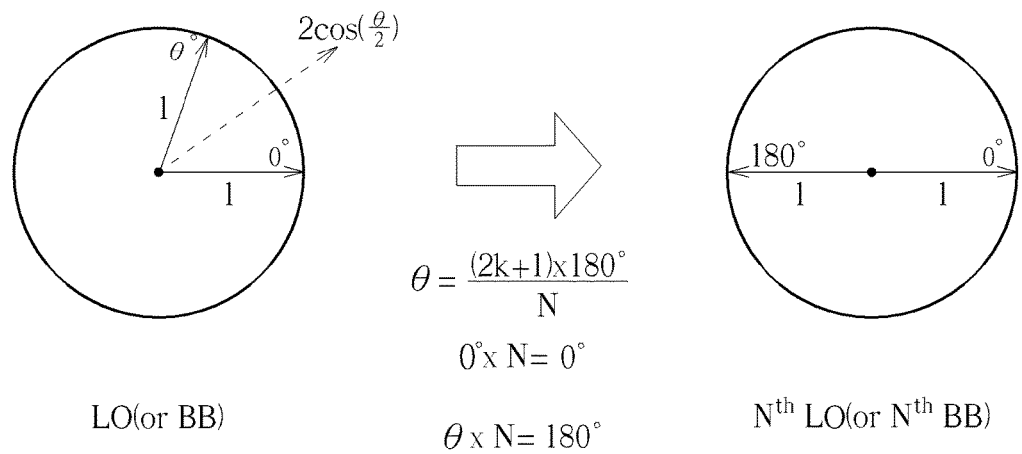
FIG. 1 is a diagram illustrating a principle of using a vector-sum to achieve the desired harmonic cancellation according to an embodiment of the present invention.

FIG. 1 is a diagram illustrating a principle of using a vector-sum to achieve the desired harmonic cancellation according to an embodiment of the present invention. The combination of a periodical signal $\cos(\omega t+0°)$ with fundamental frequency=$\omega$, peak amplitude=1 and phase=$0°$ and a phase-rotated periodical signal $\cos(\omega t+\theta)$ with fundamental frequency=$\omega$, peak amplitude=1 and phase=$\theta$ will result in a vector-sum signal $$2\cos\left(\omega t + \frac{\theta}{2}\right)$$

with fundamental frequency=$\omega$, peak amplitude=2 and $$\text{phase} = \frac{\theta}{2}.$$

If the phase rotation $\theta$ is properly selected, the $N^{th}$-order harmonic of the periodical signal $\cos(\omega t+0°)$ can be cancelled by the $N^{th}$-order harmonic of the phase-rotated periodical signal $\cos(\omega+\theta)$. For example, when $$\theta = \frac{(2k+1) \times 180°}{N},$$

the $N^{th}$-order harmonic of the phase-rotated periodical signal $\cos(\omega t+0°)$ may be expressed by $\cos(N\omega t+N\times 0°)=\cos(N\omega t+0°)$, and the $N^{th}$-order harmonic of the phase-rotated periodical signal $\cos(\omega t+\theta)$ may be expressed by $$\cos\left(N\omega t + N \times \frac{(2k+1)\times 180°}{N}\right) = \cos(N\omega t + (2k+1)\times 180°) = -\cos(N\omega t + 0°).$$

In a case where the periodical signal $\cos(\omega t+\theta)$ is a baseband signal, the $N^{th}$-order harmonic of the baseband signal can be cancelled by the vector-sum. For example, assuming N=3, the $CIM_3$ level can be lowered due to cancellation of the $3^{rd}$-order harmonic of the baseband signal (i.e., 3BB). In another case where the periodical signal $\cos(\omega t+\theta)$ is an LO signal, the $N^{th}$-order harmonic of the LO signal can be cancelled by the vector-sum. For example, assuming N=3, the $CIM_3$ level can be lowered due to cancellation of the $3^{rd}$-order harmonic of the LO signal (i.e., 3LO).

Consider a lower sideband conversion scenario, an $n^{th}$-order harmonic of a baseband signal is denoted by $BB_1^n$, an $n^{th}$-order harmonic of a phase-rotated baseband signal is denoted by $BB_2^n$, an $m^{th}$-order harmonic of an LO signal is denoted by $LO_1^m$, and an $m^{th}$-order harmonic of a phase-rotated LO signal is denoted by $LO_2^m$. The signals $BB_1^n$, $BB_2^n$, $LO_1^m$, $LO_2^m$ may be expressed using following equations.

$$BB_1^n=\cos(n\omega_{BB}t) \quad (1)$$

$$BB_2^n=\cos(n\omega_{BB}t+n\phi) \quad (2)$$

$$LO_1^m=\cos(m\omega_{LO}t) \quad (3)$$

$$LO_2^m=\cos(m\omega_{LO}t+m\theta) \quad (4)$$

In above equations (1)-(4), $\omega_{BB}$ is the fundamental frequency of the baseband signal, $\omega_{LO}$ is the fundamental frequency of the LO signal, the phase rotation of the baseband signal is $\phi$, and the phase rotation of the LO signal is $\theta$. Concerning the lower sideband conversion scenario, the mixing result of signals $BB_1^n$, $BB_2^n$, $LO_1^m$, and $LO_2^m$ may be expressed using the following equation.

$$BB_1^n \times LO_1^m + BB_2^n \times LO_2^m = \quad (5)$$
$$\frac{\cos[(m\omega_{LO}+n\omega_{BB})t]}{2} + \frac{\cos[(m\omega_{LO}+n\omega_{BB})t+(m\theta+n\phi)]}{2} +$$
$$\frac{\cos[(m\omega_{LO}-n\omega_{BB})t]}{2} + \frac{\cos[(m\omega_{LO}-n\omega_{BB})t+(m\theta-n\phi)]}{2}$$

To achieve harmonic cancellation, the vector-sum of $\cos[(m\omega_{LO}+n\omega_{BB})t]$ and $\cos[(m\omega_{LO}+n\omega_{BB})t+(m\theta+n\phi)]$ should be zero. Hence, the baseband phase rotation $\phi$ and the LO phase rotation $\theta$ should meet the following equation.

$$(m\theta+n\phi)=(2k+1)\pi \quad (6)$$

Based on the above equation (6), a harmonic-rejection mixer can be designed to achieve harmonic cancellation of target counter intermodulation products, especially the $3^{rd}$-order counter intermodulation product $CIM_3$. Several exemplary harmonic-rejection mixer designs are detailed as below.

Figure 2:
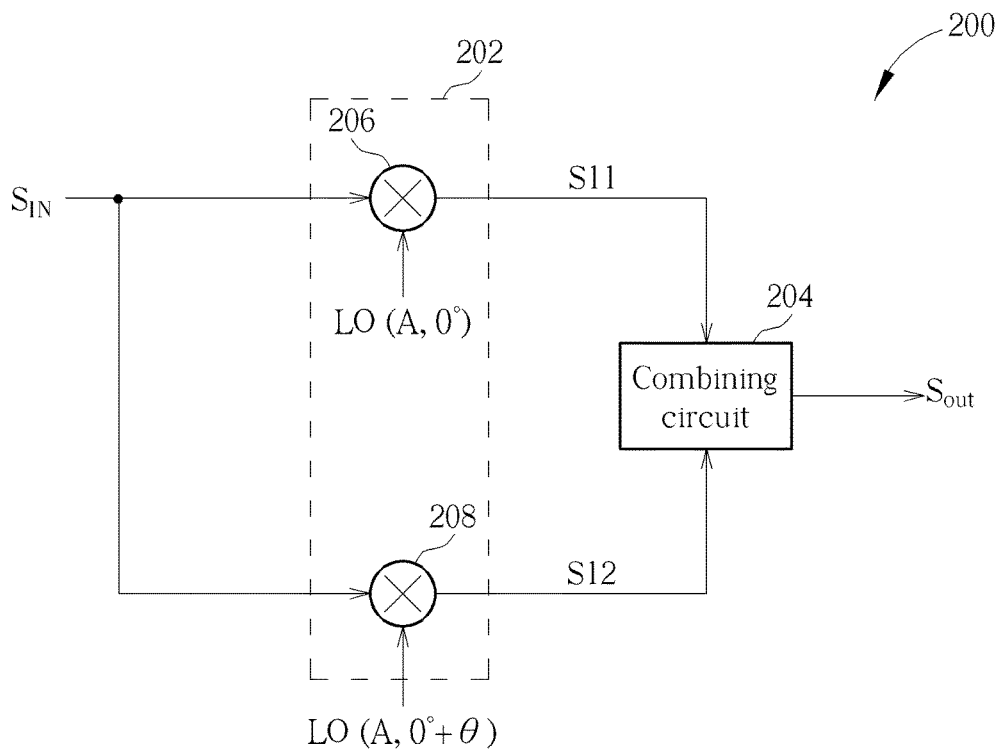
FIG. 2 is a diagram illustrating a first harmonic-rejection mixer apparatus according to an embodiment of the present invention.

FIG. 2 is a diagram illustrating a first harmonic-rejection mixer apparatus according to an embodiment of the present invention. The harmonic-rejection mixer apparatus 200 includes a mixing circuit 202 and a combining circuit 204. The mixing circuit 202 has a first mixer 206 and a second mixer 208. The mixing circuit 202 is configured to receive an input signal $S_{IN}$, a first local oscillator signal LO (A, 0°) and a second local oscillator signal LO (A, 0°+θ), and is further configured to mix the input signal $S_{IN}$ and the first local oscillator signal LO (A, 0°) at the mixer 206 to generate a first output signal S11 and mix the same input signal $S_{IN}$ and the second local oscillator signal LO (A, 0°+θ) at the mixer 208 to generate a second output signal S12. The second local oscillator signal LO (A, 0°+θ) is a phase-rotated signal with respect to the first local oscillator signal LO (A, 0°). That is, the first local oscillator signal LO (A, 0°) and the second local oscillator signal LO (A, 0°+θ) have the same peak amplitude/magnitude but different phases. Since the first local oscillator signal LO (A, 0°) and the second local oscillator signal LO (A, 0°+θ) have the same peak amplitude/magnitude A, the first local oscillator signal LO (A, 0°) used by the mixer 206 and the second local oscillator signal LO (A, 0°+θ) used by the second mixer 208 do not need to have an irrational amplitude/magnitude ratio. The combining circuit 204 is configured to combine the first output signal S11 and the second output signal S12 to generate a combined output signal $S_{OUT}$, wherein harmonic rejection is at least achieved by combination of the first output signal S11 and the second output signal S12. Since the same input signal $S_{IN}$ is fed into both of the mixers 206 and 208, no phase-rotated input signal is used in this embodiment. Hence, the baseband phase rotation $\phi$ in equation (6) is zero, and the equation (6) may be rewritten as below.

$$m\theta=(2k+1)\pi \quad (7)$$

When the LO phase rotation $\theta$ is set by $$\frac{\pi}{3}$$

(i.e., 60°), the equation (7) may be rewritten as below.

$$m=6k+3 \quad (8)$$

Hence, all $(6k+3)^{th}$-order harmonics of the LO signal can be cancelled by the harmonic-rejection mixer apparatus 200, where k is an integer not smaller than zero. Specifically, ⅙ harmonics of the LO signal can be cancelled. Since the $3^{rd}$-order harmonic of the LO signal (i.e., 3LO) can be cancelled, the $CIM_3$ level can be lowered correspondingly.

Figure 15:
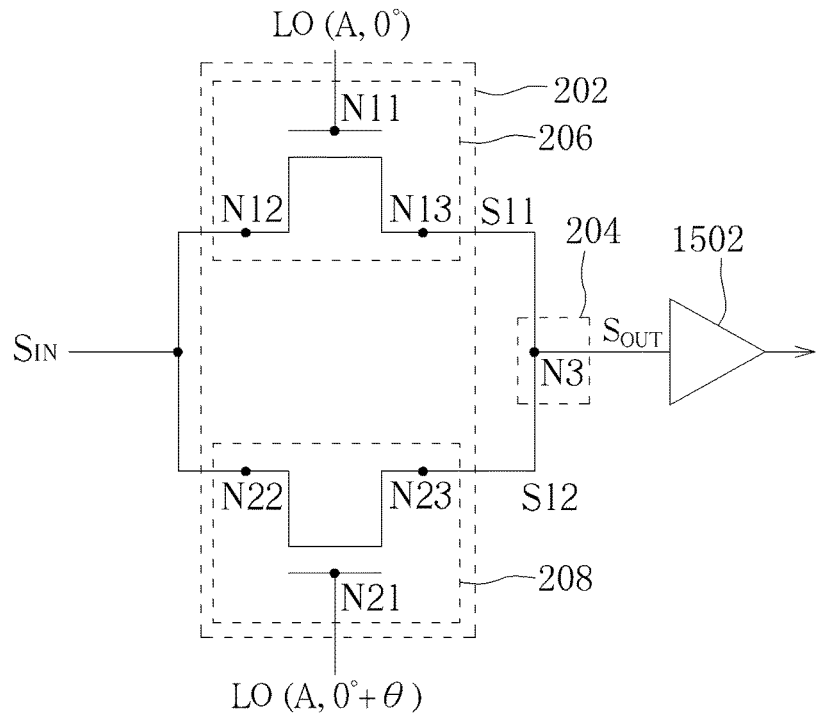
FIG. 15 is a diagram illustrating one circuit design of the first harmonic-rejection mixer apparatus shown in FIG. 2 according to an embodiment of the present invention.

Please refer to FIG. 15 in conjunction with FIG. 2. FIG. 15 is a diagram illustrating one circuit design of the first harmonic-rejection mixer apparatus shown in FIG. 2 according to an embodiment of the present invention. The first mixer 206 may be implemented using a transistor (e.g., an N-channel metal oxide semiconductor transistor) having a control node N11, a first connection node N12 and a second connection node N13. The second mixer 208 may be implemented using a transistor (e.g., an N-channel metal oxide semiconductor transistor) having a control node N21, a first connection node N22 and a second connection node N23. In addition, the combining circuit 204 may be implemented using an interconnection node N3. Concerning the first mixer 206, the control node N11 is used to receive the first local oscillator signal LO (A, 0°), the first connection node N12 is used to receive the input signal $S_{IN}$, and the second connection node N13 is used to output the first output signal S11 to the interconnection node N3. Concerning the second mixer 208, the control node N21 is used to receive the second local oscillator signal LO (A, 0°+θ), the first connection node N22 is used to receive the input signal $S_{IN}$, and the second connection node N23 is used to output the second output signal S12 to the interconnection node N3. The first output signal S11 and the second output signal S12 are combined at the interconnection node N3 to generate the combined output signal $S_{OUT}$. In this embodiment, the combined output signal $S_{OUT}$ may be further processed by an optional amplifier 1502 and then fed into a following processing circuit (not shown).

Figure 3:
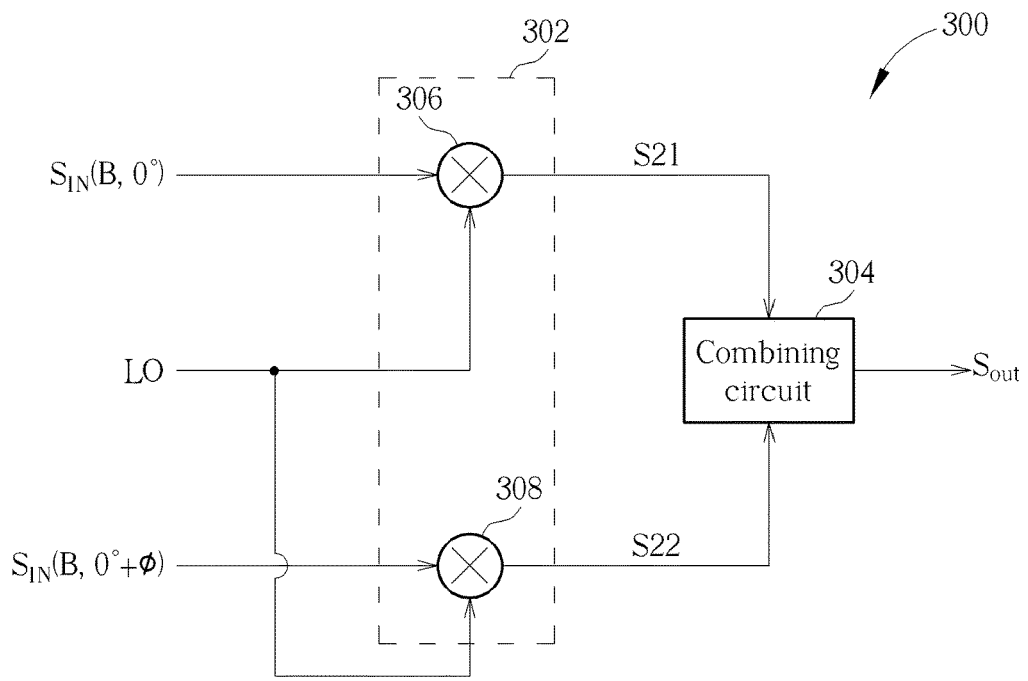
FIG. 3 is a diagram illustrating a second harmonic-rejection mixer apparatus according to an embodiment of the present invention.

FIG. 3 is a diagram illustrating a second harmonic-rejection mixer apparatus according to an embodiment of the present invention. The harmonic-rejection mixer apparatus 300 includes a mixing circuit 302 and a combining circuit 304. The mixing circuit 302 has a first mixer 306 and a second mixer 308. The mixing circuit 302 is configured to receive a first input signal $S_{IN}$ (B, 0°), a second input signal $S_{IN}$ (B, 0°+φ), and a local oscillator signal LO, and is further configured to mix the first input signal $S_{IN}$ (B, 0°) and the local oscillator signal LO at the mixer 306 to generate a first output signal S21 and mix the second input signal $S_{IN}$ (B, 0°+φ) and the same local oscillator signal LO at the mixer 308 to generate a second output signal S22. The second input signal $S_{IN}$ (B, 0°+φ) is a phase-rotated signal with respect to the first input signal $S_{IN}$ (B, 0°). That is, the first input signal $S_{IN}$ (B, 0°) and the second input signal $S_{IN}$ (B, 0°+φ) have the same peak amplitude/magnitude B but different phases. Hence, the first input signal $S_{IN}$ (B, 0°) used by the mixer 306 and the second input signal $S_{IN}$ (B, 0°+φ) used by the second mixer 308 do not need to have an irrational amplitude/magnitude ratio. The combining circuit 304 is configured to combine the first output signal S21 and the second output signal S22 to generate a combined output signal $S_{OUT}$, wherein harmonic rejection is at least achieved by combination of the first output signal S21 and the second output signal S22. Since the same local oscillator signal LO is fed into both of the mixers 306 and 308, no phase-rotated local oscillator signal is used in this embodiment. Hence, the LO phase rotation θ in equation (6) is zero, and the equation (6) may be rewritten as below.

$$n\phi = (2k+1)\pi \quad (9)$$

When the baseband phase rotation φ is set by $$\frac{\pi}{3}$$

(i.e., 60°), the equation (9) may be rewritten as below.

$$n = 6k+3 \quad (10)$$

Hence, all $(6k+3)^{th}$-order harmonics of the baseband signal can be cancelled by the harmonic-rejection mixer apparatus 300, where k is an integer not smaller than zero. Specifically, ⅙ harmonics of the baseband signal can be cancelled. Since the $3^{rd}$-order harmonic of the baseband signal (i.e., 3BB) can be cancelled, the $CIM_3$ level can be lowered correspondingly.

Figure 16:
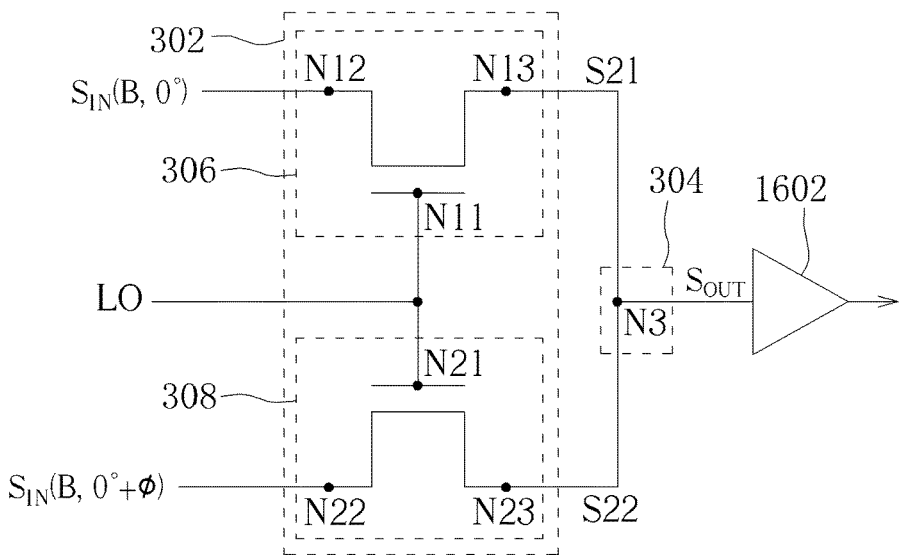
FIG. 16 is a diagram illustrating one circuit design of the second harmonic-rejection mixer apparatus shown in FIG. 3 according to an embodiment of the present invention.

Please refer to FIG. 16 in conjunction with FIG. 3. FIG. 16 is a diagram illustrating one circuit design of the second harmonic-rejection mixer apparatus shown in FIG. 3 according to an embodiment of the present invention. The first mixer 306 may be implemented using a transistor (e.g., an N-channel metal oxide semiconductor transistor) having a control node N11, a first connection node N12 and a second connection node N13. The second mixer 308 may be implemented using a transistor (e.g., an N-channel metal oxide semiconductor transistor) having a control node N21, a first connection node N22 and a second connection node N23. In addition, the combining circuit 304 may be implemented using an interconnection node N3. Concerning the first mixer 306, the control node N11 is used to receive the local oscillator signal LO, the first connection node N12 is used to receive the first input signal $S_{IN}$ (B, 0°), and the second connection node N13 is used to output the first output signal S21 to the interconnection node N3. Concerning the second mixer 308, the control node N21 is used to receive the local oscillator signal LO, the first connection node N22 is used to receive the second input signal $S_{IN}$ (B, 0°+φ), and the second connection node N23 is used to output the second output signal S22 to the interconnection node N3. The first output signal S21 and the second output signal S22 are combined at the interconnection node N3 to generate the combined output signal $S_{OUT}$. In this embodiment, the combined output signal $S_{OUT}$ may be further processed by an optional amplifier 1602 and then fed into a following processing circuit (not shown).

A signal loss at the desired lower side band $\omega_{LO}$-$\omega_{BB}$ under the lower sideband conversion scenario may be expressed by $$1 - \cos^2\left(\frac{m\theta - n\phi}{2}\right).$$

To avoid signal loss at the lower side band $\omega_{LO}$-$\omega_{BB}$, the LO phase rotation θ and the baseband phase rotation φ need to satisfy the following equation.

$$\phi = \theta \quad (11)$$

With regard to the harmonic-rejection mixer apparatus 200 shown in FIG. 2, the LO phase rotation θ is set by $$\frac{\pi}{3},$$

while there is no baseband phase rotation φ (i.e., φ=0°). Since equation (11) is not satisfied, the signal loss at the lower side band $\omega_{LO}$-$\omega_{BB}$ may be ¼. With regard to the harmonic-rejection mixer apparatus 300 shown in FIG. 3, the baseband phase rotation φ is set by $$\frac{\pi}{3},$$

while there is no LO phase rotation θ (i.e., θ=0°). Since equation (11) is not satisfied, the signal loss at the lower side band $\omega_{LO}$-$\omega_{BB}$ may be ¼.

To avoid signal loss at the lower side band $\omega_{LO}$-$\omega_{BB}$ while achieving the desired harmonic cancellation, the above-mentioned equations (6) and (11) should be both satisfied. The equation (6) may be rewritten as below.

$$(m\theta + n\phi) = (m+n)\theta = (m+n)\phi = (2k+1)\pi \quad (12)$$

Figure 4:
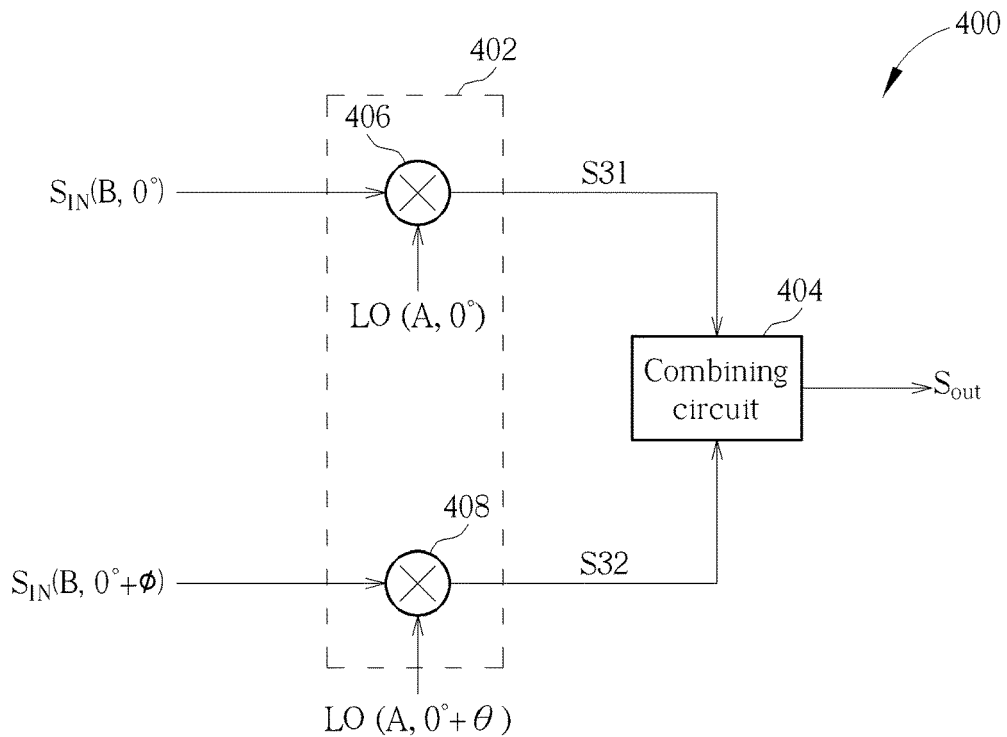
FIG. 4 is a diagram illustrating a third harmonic-rejection mixer apparatus according to an embodiment of the present invention.

Based on the above equation (12), a harmonic-rejection mixer can be designed to avoid signal loss at the lower side band $\omega_{LO}$-$\omega_{BB}$ and achieve harmonic cancellation of target counter intermodulation products, especially the $3^{rd}$-order counter intermodulation product $CIM_3$. FIG. 4 is a diagram illustrating a third harmonic-rejection mixer apparatus according to an embodiment of the present invention. The harmonic-rejection mixer apparatus 400 includes a mixing circuit 402 and a combining circuit 404. The mixing circuit 402 has a first mixer 406 and a second mixer 408. The mixing circuit 402 is configured to receive a first input signal $S_{IN}$ (B, 0°), a second input signal (B, 0°+φ), a first local oscillator signal LO (A, 0°) and a second local oscillator signal LO (A, 0°+θ), and is further configured to mix the first input signal $S_{IN}$ (B, 0°) and the first local oscillator signal LO (A, 0°) at the mixer 406 to generate a first output signal S31 and mix the second input signal $S_{IN}$ (B, 0°+φ) and the second local oscillator signal LO (A, 0°+θ) at the mixer 408 to generate a second output signal S32. The second local oscillator signal LO (A, 0°+θ) is a phase-rotated signal with respect to the first local oscillator signal LO (A, 0°). That is, the first local oscillator signal LO (A, 0°) and the second local oscillator signal LO (A, 0°+θ) have the same frequency but different phases. In this embodiment, the first local oscillator signal LO (A, 0°) and the second local oscillator signal LO (A, 0°+θ) have the same peak amplitude/magnitude A. Hence, the first local oscillator signal LO (A, 0°) used by the mixer 406 and the second local oscillator signal LO (A, 0°+θ) used by the second mixer 408 do not need to have an irrational amplitude/magnitude ratio. In addition, the second input signal $S_{IN}$ (B, 0°+φ) is a phase-rotated signal with respect to the first input signal $S_{IN}$ (B, 0°). Hence, the first input signal $S_{IN}$ (B, 0°) and the second input signal $S_{IN}$ (B, 0°+φ) have the same peak amplitude/magnitude B but different phases. Hence, the first input signal $S_{IN}$ (B, 0°) used by the mixer 406 and the second input signal $S_{IN}$ (B, 0°+φ) used by the second mixer 408 do not need to have an irrational amplitude/magnitude ratio.

The combining circuit 404 is configured to combine the first output signal S31 and the second output signal S32 to generate a combined output signal $S_{OUT}$, wherein harmonic rejection is at least achieved by combination of the first output signal S31 and the second output signal S32.

When the LO phase rotation θ and the baseband phase rotation φ are both set by the same value, say, $$\frac{\pi}{4}$$

(i.e., 45°), the equation (12) may be rewritten as below.

$$m+n=8k+4 \qquad (13)$$

Hence, ⅛ harmonics of the LO signal and the baseband signal can be cancelled. For example, the $1^{st}$-order harmonic of the LO signal (m=1) and the $3^{rd}$-order harmonic of the baseband signal (n=3) can be cancelled, the $2^{nd}$-order harmonic of the LO signal (m=2) and the $2^{nd}$-order harmonic of the baseband signal (n=2) can be cancelled, the $3^{rd}$-order harmonic of the LO signal (m=3) and the $1^{st}$-order harmonic of the baseband signal (n=1) can be cancelled, and so forth. Since the $3^{rd}$-order harmonic of the LO signal (i.e., 3LO) and the $3^{rd}$-order harmonic of the baseband signal (i.e., 3BB) can be cancelled, the $CIM_3$ level can be lowered correspondingly. In addition, since the LO phase rotation θ and the baseband phase rotation φ are both set by the same phase value, there is no signal loss at the lower side band $\omega_{LO}$-$\omega_{BB}$. It should be noted that assigning $$\frac{\pi}{4}$$

(i.e., 45°) to both of the LO phase rotation θ and the baseband phase rotation φ is for illustrative purposes only, and is not meant to be a limitation of the present invention. In other embodiments, both of the LO phase rotation θ and the baseband phase rotation φ may be set by a phase value different from $$\frac{\pi}{4}.$$

These alternative designs also fall within the scope of the present invention.

Figure 17:
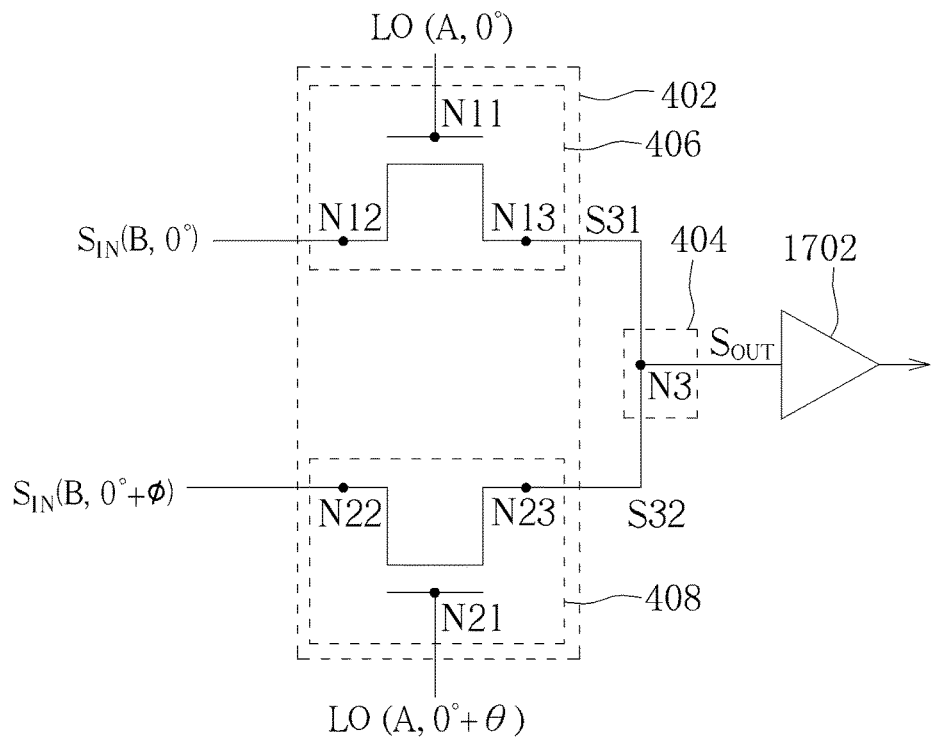
FIG. 17 is a diagram illustrating one circuit design of the third harmonic-rejection mixer apparatus shown in FIG. 4 according to an embodiment of the present invention.

Please refer to FIG. 17 in conjunction with FIG. 4. FIG. 17 is a diagram illustrating one circuit design of the third harmonic-rejection mixer apparatus shown in FIG. 4 according to an embodiment of the present invention. The first mixer 406 may be implemented using a transistor (e.g., an N-channel metal oxide semiconductor transistor) having a control node N11, a first connection node N12 and a second connection node N13. The second mixer 408 may be implemented using a transistor (e.g., an N-channel metal oxide semiconductor transistor) having a control node N21, a first connection node N22 and a second connection node N23. In addition, the combining circuit 404 may be implemented using an interconnection node N3. Concerning the first mixer 406, the control node N11 is used to receive the first local oscillator signal LO (A, 0°), the first connection node N12 is used to receive the first input signal $S_{IN}$ (B, 0°), and the second connection node N13 is used to output the first output signal S31 to the interconnection node N3. Concerning the second mixer 408, the control node N21 is used to receive the second local oscillator signal LO (A, 0°+θ), the first connection node N22 is used to receive the second input signal $S_{IN}$ (B, 0°+θ), and the second connection node N23 is used to output the second output signal S32 to the interconnection node N3. The first output signal S31 and the second output signal S32 are combined at the interconnection node N3 to generate the combined output signal $S_{OUT}$. In this embodiment, the combined output signal $S_{OUT}$ may be further processed by an optional amplifier 1702 and then fed into a following processing circuit (not shown).

In each of the exemplary embodiments shown in FIGS. 15-17, one optional amplifier 1502/1602/1702 may be placed after the combining circuit 204/304/404 to amplifier the combined output signal $S_{OUT}$. Alternatively, optional amplifiers may be placed before the combining circuit 204/304/404.

Figure 18:
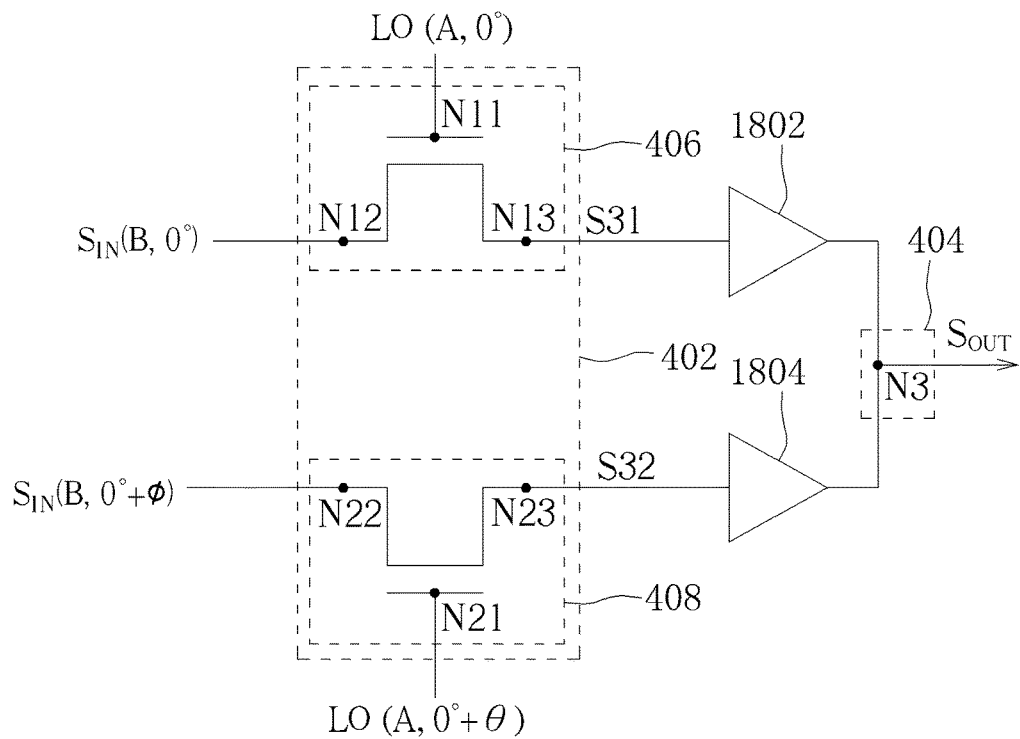
FIG. 18 is a diagram illustrating another circuit design of the third harmonic-rejection mixer apparatus shown in FIG. 4 according to an embodiment of the present invention.

FIG. 18 is a diagram illustrating another circuit design of the third harmonic-rejection mixer apparatus shown in FIG. 4 according to an embodiment of the present invention. The major difference between the circuit designs shown in FIG. 17 and FIG. 18 is that the circuit design shown in FIG. 18 has a first optional amplifier 1802 and a second optional amplifier 1804, where the first optional amplifier 1802 is coupled between the second connection node N13 and the interconnection node N3, and the second optional amplifier 1804 is coupled between the second connection node N23 and the interconnection node N3. Hence, the first output signal S31 and the second output signal S32 are amplified and then combined at the interconnection node N3.

Figure 19:
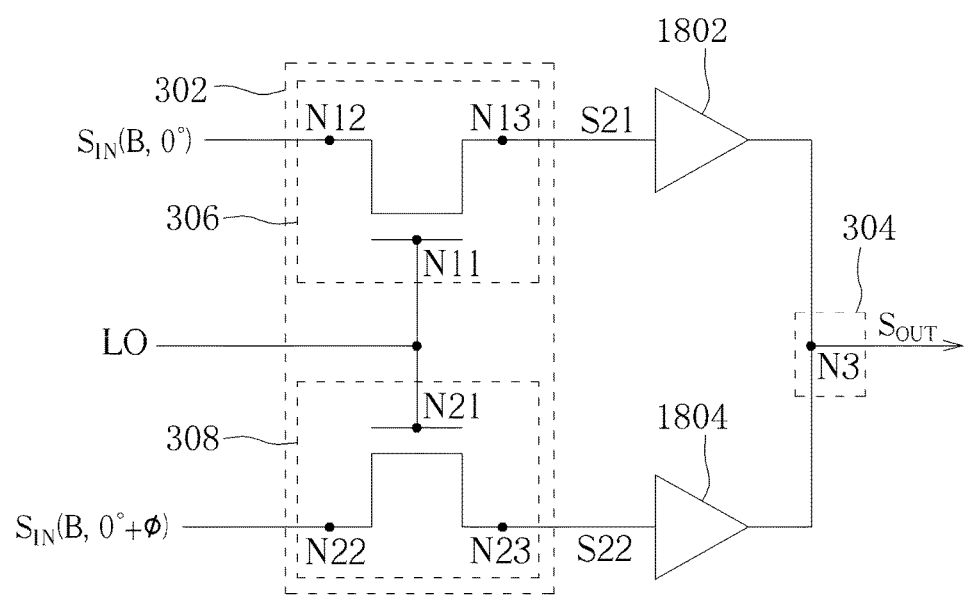
FIG. 19 is a diagram illustrating another circuit design of the second harmonic-rejection mixer apparatus shown in FIG. 3 according to an embodiment of the present invention.

Similarly, the circuit design shown in FIG. 15 may be modified to have two optional amplifiers for amplifying the first output signal S11 and the second output signal S12 to generate amplified output signals to the interconnection node N3 for signal combination, and the circuit design shown in FIG. 16 may be modified to have two optional amplifiers for amplifying the first output signal S21 and the second output signal S22 to generate amplified output signals to the interconnection node N3 for signal combination, as illustrated in FIG. 19. Since a person skilled in the art can readily understand details of the modified circuit designs after reading above paragraph directed to the modified circuit design shown in FIG. 18, further description is omitted here for brevity.

In addition to using a phase-rotated input signal and/or a phase-rotated LO signal, choosing a proper LO duty cycle may provide additional harmonic rejection. For example, an LO signal may be a square wave that can be expressed using the following equation.

$$LO = \sum_n \frac{\sin(n\pi d)}{n\pi d} \cos(n\omega_{LO} t), \text{ where } d \text{ is duty cycle} \quad (14)$$

If the LO signal is a square wave with a duty cycle of 50%, the LO signal has no $2^{nd}$-order, $4^{th}$-order, $6^{th}$-order, $8^{th}$-order, harmonics; if the LO signal is a square wave with a duty cycle of 33%, the LO signal has no $3^{rd}$-order, $6^{th}$-order, $9^{th}$-order, $12^{th}$-order, ... harmonics; and if the LO signal is a square wave with a duty cycle of 25%, the LO signal has no $4^{th}$-order, $8^{th}$-order, $12^{th}$-order, $16^{th}$-order, ... harmonics. The LO signal and the phase-rotated LO signal may be configured to have the same duty cycle to make the LO generator design easier and more current-efficient. However, choosing a proper LO duty cycle to provide additional harmonic rejection is optional. That is, any harmonic-rejection mixer using phase-rotated input signal(s) and/or phase-rotated LO signal(s) to achieve target harmonic cancellation by vector-sum falls within the scope of the present invention.

Any of the proposed harmonic-rejection mixer designs shown in FIGS. 2-4 may be employed by a modulator of a transmitter. For example, any of the proposed harmonic-rejection mixer designs shown in FIGS. 2-4 may be used to up-convert a baseband signal to a radio-frequency signal in a direct-conversion transmitter.

Figure 5:
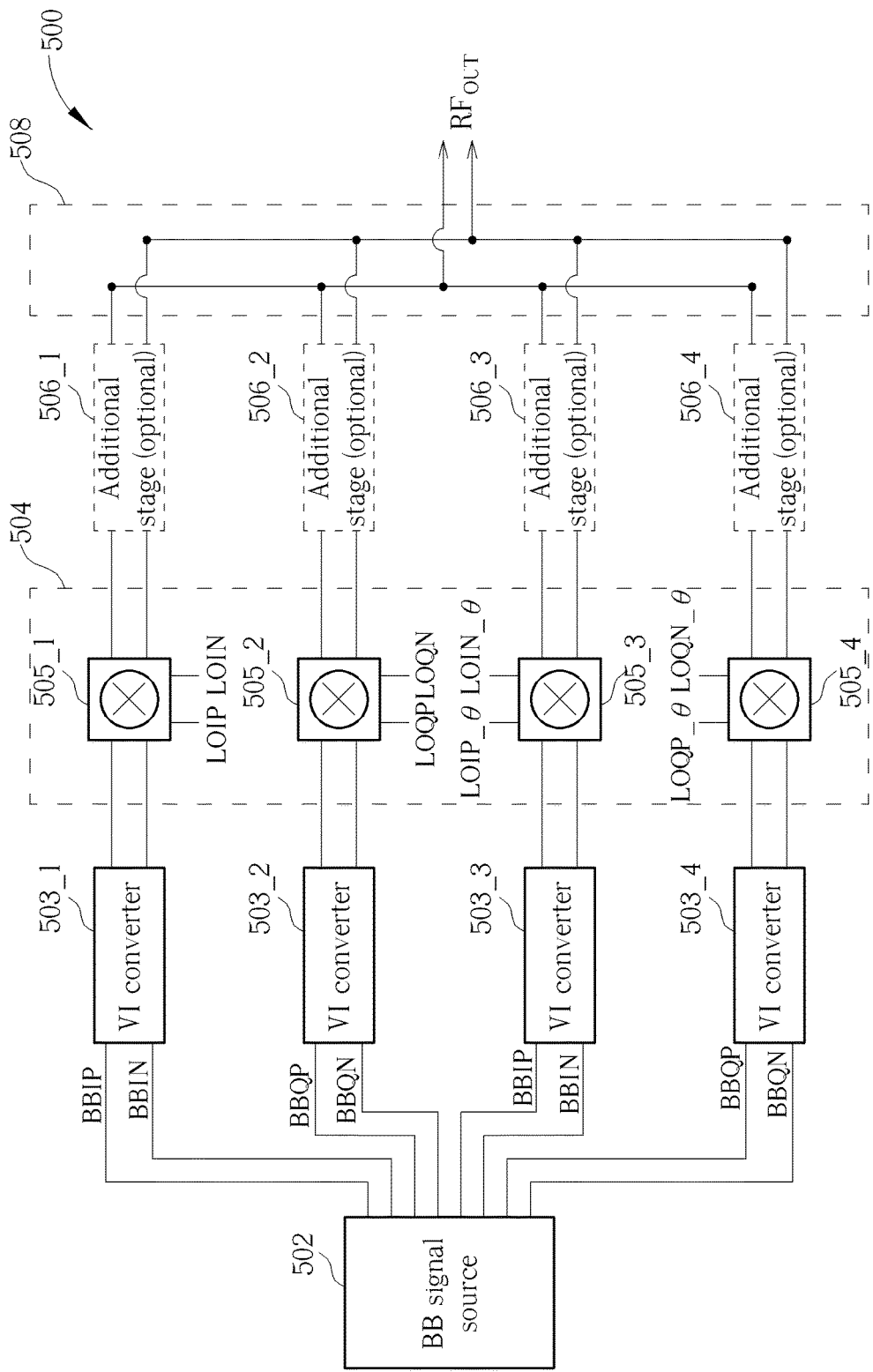
FIG. 5 is a diagram illustrating a first phase-rotated harmonic-rejection modulator according to an embodiment of the present invention.

FIG. 5 is a diagram illustrating a first phase-rotated harmonic-rejection modulator according to an embodiment of the present invention. The proposed harmonic-rejection mixer apparatuses 200 shown in FIG. 2 are implemented in the phase-rotated harmonic-rejection modulator 500. In this embodiment, the phase-rotated harmonic-rejection modulator 500 includes a baseband signal source 502, a plurality of voltage-to-current converters (VI converters) 503_1-503_4, a mixing circuit 504, a plurality of additional stages (e.g., amplifiers) 506_1-506_4, and a combining circuit 508. The mixing circuit 504 includes a plurality of mixers 505_1-505_4. The additional stages (e.g., amplifiers) 506_1-506_4 may be optional, depending upon the actual design considerations.

The baseband signal source 502 is configured to generate and output two identical first pairs of out-of-phase baseband signals BBIP and BBIN and two identical second pairs of out-of-phase baseband signals BBQP and BBQN. The first pair of out-of-phase baseband signals BBIP and BBIN and the second pair of out-of-phase baseband signals BBQP and BBQN have a 90-degree phase difference. More specifically, the baseband signals BBIP and BBQP have a 90-degree phase difference, and the baseband signals BBIN and BBQN have a 90-degree phase difference. In this embodiment, the out-of-phase baseband signals BBIP and BBIN are differential in-phase (I) baseband signals, and the out-of-phase baseband signals BBQP and BBQN are differential quadrature (Q) baseband signals.

Since the above-mentioned signal combination needed for harmonic cancellation is performed by current (waveform) combination and the output of the baseband signal source 502 contains voltage signals that cannot be combined directly, the voltage-to-current converters 503_1-503_4 are needed. In this way, the combining circuit 508 can perform current combination to do vector-sum for harmonic cancellation. The voltage-to-current converter 503_1 is configured to perform voltage-to-current conversion upon each of the incoming baseband signals BBIP and BBIN to generate a corresponding input signal to the following mixer 505_1. The voltage-to-current converter 503_2 is configured to perform voltage-to-current conversion upon each of the incoming baseband signals BBQP and BBQN to generate a corresponding input signal to the following mixer 505_2. The voltage-to-current converter 503_3 is configured to perform voltage-to-current conversion upon each of the incoming baseband signals BBIP and BBIN to generate a corresponding input signal to the following mixer 505_3. The voltage-to-current converter 503_4 is configured to perform voltage-to-current conversion upon each of the incoming baseband signals BBQP and BBQN to generate a corresponding input signal to the following mixer 505_4.

The mixer 505_1 is configured to receive input signals that are current signals of the baseband signals BBIP, BBIN and a first pair of out-of-phase LO signals LOIP, LOIN. The mixer 505_2 is configured to receive input signals that are current signals of the baseband signals BBQP, BBQN and a second pair of out-of-phase LO signals LOQP, LOQN. The mixer 505_3 is configured to receive input signals that are current signals of the baseband signals BBIP, BBIN and a third pair of out-of-phase LO signals LOIP_θ, LOIN_θ. The mixer 505_4 is configured to receive input signals that are current signals of the baseband signals BBQP, BBQN and a fourth pair of out-of-phase LO signals LOQP_θ, LOQN_θ. The first pair of out-of-phase LO signals LOIP and LOIN and the second pair of out-of-phase LO signals LOQP and LOQN have a 90-degree phase difference. That is, the LO signals LOIP and LOQP have a 90-degree phase difference, and the LO signals LOIN and LOQN have a 90-degree phase difference. The third pair of out-of-phase LO signals LOIP_θ, LOIN_θ and the fourth pair of out-of-phase LO signals LOQP_θ, LOQN_θ have a 90-degree phase difference. That is, the LO signals LOIP_θ and LOQP_θ have a 90-degree phase difference, and the LO signals LOIN_θ and LOQN_θ have a 90-degree phase difference. In this embodiment, the LO signal LOIP_θ is a phase-rotated signal of the LO signal LOIP, the LO signal LOIN_θ is a phase-rotated signal of the LO signal LOIN, the LO signal LOQP_θ is a phase-rotated signal of the LO signal LOQP, and the LO signal LOQN_θ is a phase-rotated signal of the LO signal LOQN. In one embodiment of the present invention, LO signals LOIP, LOIN, LOIP_θ, LOIP_θ, LOQP, LOQN, LOQP_θ, LOQN_θ with the same peak amplitude/magnitude and/or the same duty cycle are supplied to the mixing circuit 504.

In this embodiment, the proposed harmonic-rejection mixer apparatuses 200 shown in FIG. 2 are implemented in the phase-rotated harmonic-rejection modulator 500. When the input signal $S_{IN}$ is the current signal of the baseband signal BBIP, the mixer 206 is the mixer 505_1, the mixer 208 is the mixer 505_3, the local oscillator signal LO (A, 0°) is the LO signal LOIP, and the phase-rotated local oscillator signal LO (A, 0°+θ) is the LO signal LOIP_θ. When the input signal $S_{IN}$ is the current signal of the baseband signal BBIN, the mixer 206 is the mixer 505_1, the mixer 208 is the mixer 505_3, the local oscillator signal LO (A, 0°) is the LO signal LOIN, and the phase-rotated local oscillator signal LO (A, 0°+θ) is the LO signal LOIN_θ. When the input signal $S_{IN}$ is the current signal of the baseband signal BBQP, the mixer 206 is the mixer 505_2, the mixer 208 is the mixer 505_4, the local oscillator signal LO (A, 0°) is the LO signal LOQP, and the phase-rotated local oscillator signal LO (A, 0°+θ) is the LO signal LOQP_θ. When the input signal $S_{IN}$ is the current signal of the baseband signal BBQN, the mixer 206 is the mixer 505_2, the mixer 208 is the mixer 505_4, the local oscillator signal LO (A, 0°) is the LO signal LOQN, and the phase-rotated local oscillator signal LO (A, 0°+θ) is the LO signal LOQN_θ.

When the additional stages (e.g., amplifiers) 506_1-506_4 are implemented in the phase-rotated harmonic-rejection modulator 500, outputs of the mixers 505_1-505_4 may be processed by the additional stages (e.g., amplifiers) 506_1-506_4 and then combined by the combining circuit 508 to generate a harmonic-rejected RF output signal $RF_{OUT}$. However, when the additional stages (e.g., amplifiers) 506_1-506_4 are omitted from the phase-rotated harmonic-rejection modulator 500, outputs of the mixers 505_1-505_4 may be directly combined by the combining circuit 508 to generate the harmonic-rejected RF output signal $RF_{OUT}$.

Figure 6:
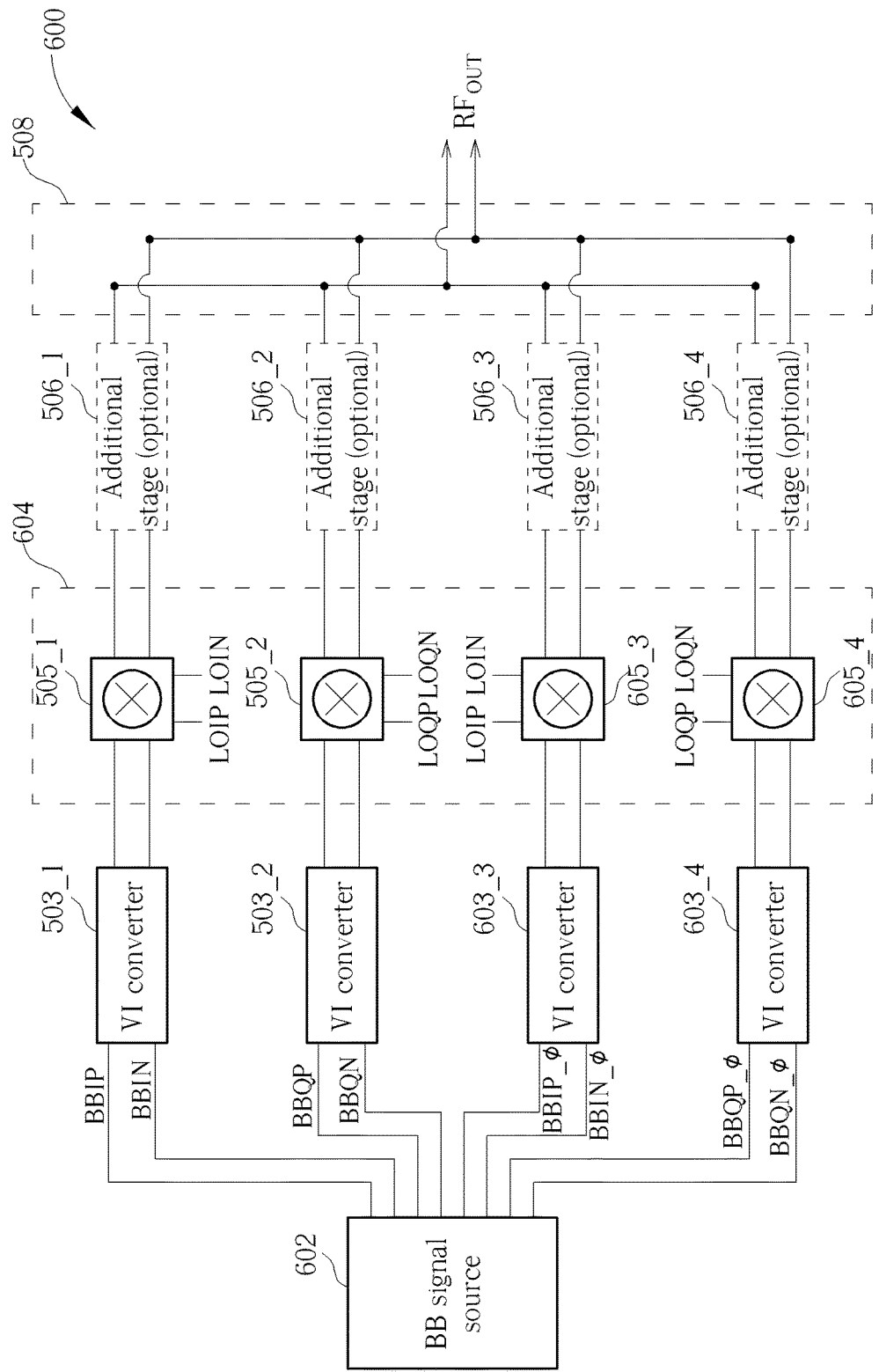
FIG. 6 is a diagram illustrating a second phase-rotated harmonic-rejection modulator according to an embodiment of the present invention.

FIG. 6 is a diagram illustrating a second phase-rotated harmonic-rejection modulator according to an embodiment of the present invention. The proposed harmonic-rejection mixer apparatuses 300 shown in FIG. 3 are implemented in the phase-rotated harmonic-rejection modulator 600. In this embodiment, the phase-rotated harmonic-rejection modulator 600 includes a baseband signal source 602, a plurality of voltage-to-current converters (VI converters) 503_1, 503_2, 603_3, 603_4, a mixing circuit 604, and a plurality of additional stages (e.g., amplifiers) 506_1-506_4, and a combining circuit 508. The mixing circuit 604 includes a plurality of mixers 505_1, 505_2, 605_3, 605_4. As mentioned above, the additional stages (e.g., amplifiers) 506_1-506_4 may be optional, depending upon the actual design considerations.

The baseband signal source 602 is configured to generate and output a first pair of out-of-phase baseband signals BBIP and BBIN, a second pair of out-of-phase baseband signals BBQP and BBQN, a third pair of out-of-phase baseband signals BBIP_ϕ and BBIN_ϕ, and a fourth pair of out-of-phase baseband signals BBQP_ϕ and BBQN_ϕ. The first pair of out-of-phase baseband signals BBIP, BBIN and the second pair of out-of-phase baseband signals BBQP, BBQN have a 90-degree phase difference, and the third pair of out-of-phase baseband signals BBIP_ϕ, BBIN_ϕ and the fourth pair of out-of-phase baseband signals BBQP_ϕ, BBQN_ϕ have a 90-degree phase difference. That is, the baseband signals BBIP and BBQP have a 90-degree phase difference, the baseband signals BBIN and BBQN have a 90-degree phase difference, the baseband signals BBIP_ϕ and BBQP_ϕ have a 90-degree phase difference, and the baseband signal BBIN_ϕ and BBQN_ϕ have a 90-degree phase difference. In this embodiment, the out-of-phase baseband signals BBIP and BBIN are differential in-phase (I) baseband signals, the out-of-phase baseband signals BBQP and BBQN are differential quadrature (Q) baseband signals, the out-of-phase baseband signals BBIP_ϕ and BBIN_ϕ are differential phase-rotated in-phase (I) baseband signals, and the out-of-phase baseband signals BBQP_ϕ and BBQN_ϕ are differential phase-rotated quadrature (Q) baseband signals.

Since the above-mentioned signal combination needed for harmonic cancellation is performed by current (waveform) combination and the output of the baseband signal source 602 contains voltage signals that cannot be combined directly, the voltage-to-current converters 503_1, 503_2, 603_1, 603_4 are needed. In this way, the combining circuit 508 can perform current combination to do vector-sum for harmonic cancellation. The voltage-to-current converter 503_1 is configured to perform voltage-to-current conversion upon each of the incoming baseband signals BBIP and BBIN to generate a corresponding input signal to the following mixer 505_1. The voltage-to-current converter 503_2 is configured to perform voltage-to-current conversion upon each of the incoming baseband signals BBQP and BBQN to generate a corresponding input signal to the following mixer 505_2. The voltage-to-current converter 603_3 is configured to perform voltage-to-current conversion upon each of the incoming baseband signals BBIP_ϕ and BBIN_ϕ to generate a corresponding input signal to the following mixer 605_3. The voltage-to-current converter 503_4 is configured to perform voltage-to-current conversion upon each of the incoming baseband signals BBQP_ϕ and BBQN_ϕ to generate a corresponding input signal to the following mixer 605_4.

The mixer 505_1 is configured to receive input signals that are current signals of the baseband signals BBIP, BBIN and a first pair of out-of-phase LO signals LOIP, LOIN. The mixer 505_2 is configured to receive input signals that are current signals of the baseband signals BBQP, BBQN and a second pair of out-of-phase LO signals LOQP, LOQN. The mixer 605_3 is configured to receive input signals that are current signals of the baseband signals BBIP_ϕ, BBIN_ϕ and the first pair of out-of-phase LO signals LOIP, LOIN. The mixer 605_4 is configured to receive input signals that are current signals of the baseband signals BBQP_ϕ, BBQN_ϕ and the second pair of out-of-phase LO signals LOQP, LOQN. The first pair of out-of-phase LO signals LOIP and LOIN and the second pair of out-of-phase LO signals LOQP and LOQN have a 90-degree phase difference. That is, the LO signals LOIP and LOQP have a 90-degree phase difference, and the LO signals LOIN and LOQN have a 90-degree phase difference. In one embodiment of the present invention, LO signals LOIP, LOIN, LOQP, LOQN with the same peak amplitude/magnitude and/or the same duty cycle are supplied to the mixing circuit 604.

In this embodiment, the proposed harmonic-rejection mixer apparatuses 300 shown in FIG. 3 are implemented in the phase-rotated harmonic-rejection modulator 600. When the input signal $S_{IN}$ (B, 0°) is the current signal of the baseband signal BBIP, the phase-rotated input signal $S_{IN}$ (B, 0°+ϕ) is the current signal of the baseband signal BBIP_ϕ, the mixer 306 is the mixer 505_1, the mixer 308 is the mixer 605_3, and the local oscillator signal LO is the LO signal LOIP. When the input signal $S_{IN}$ (B, 0°) is the current signal of the baseband signal BBIN, the phase-rotated input signal $S_{IN}$ (B, 0°+ϕ) is the current signal of the baseband signal BBIN_ϕ, the mixer 306 is the mixer 505_1, the mixer 308 is the mixer 605_3, and the local oscillator signal LO is the LO signal LOIN. When the input signal $S_{IN}$ (B, 0°) is the current signal of the baseband signal BBQP, the phase-rotated input signal $S_{IN}$ (B, 0°+ϕ) is the current signal of the baseband signal BBQP_ϕ, the mixer 306 is the mixer 505_2, the mixer 308 is the mixer 605_4, and the local oscillator signal LO is the LO signal LOQP. When the input signal $S_{IN}$ (B, 0°) is the current signal of the baseband signal BBQN, the phase-rotated input signal $S_{IN}$ (B, 0°+ϕ) is the current signal of the baseband signal BBQN_φ, the mixer 306 is the mixer 505_2, the mixer 308 is the mixer 605_4, and the local oscillator signal LO is the LO signal LOQN.

When the additional stages (e.g., amplifiers) 506_1-506_4 are implemented in the phase-rotated harmonic-rejection modulator 600, outputs of the mixers 505_1-505_4 may be processed by the additional stages (e.g., amplifiers) 506_1-506_4 and then combined by the combining circuit 508 to generate a harmonic-rejected RF output signal $RF_{OUT}$. However, when the additional stages (e.g., amplifiers) 506_1-506_4 are omitted from the phase-rotated harmonic-rejection modulator 600, outputs of the mixers 505_1-505_4 may be directly combined by the combining circuit 508 to generate the harmonic-rejected RF output signal $RF_{OUT}$.

Figure 7:
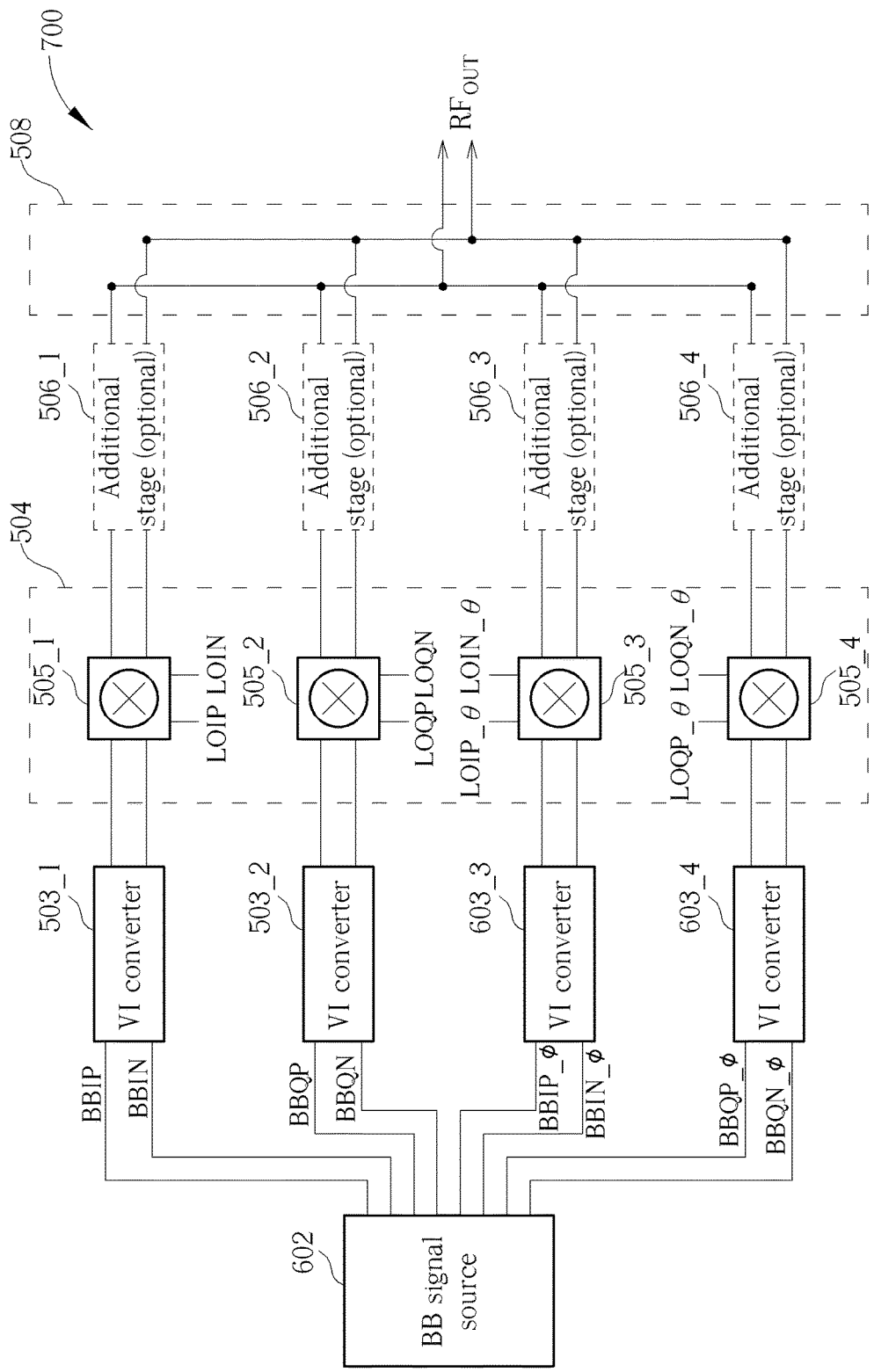
FIG. 7 is a diagram illustrating a third phase-rotated harmonic-rejection modulator according to an embodiment of the present invention.

FIG. 7 is a diagram illustrating a third phase-rotated harmonic-rejection modulator according to an embodiment of the present invention. The proposed harmonic-rejection mixer apparatuses 400 shown in FIG. 4 are implemented in the phase-rotated harmonic-rejection modulator 700. In this embodiment, the phase-rotated harmonic-rejection modulator 700 includes a baseband signal source 602, a plurality of voltage-to-current converters (VI converters) 503_1, 503_2, 603_3, 603_4, a mixing circuit 504, a plurality of additional stages (e.g., amplifiers) 506_1-506_4, and a combining circuit 508. The mixing circuit 504 includes a plurality of mixers 505_1-505_4. As mentioned above, the additional stages (e.g., amplifiers) 506_1-506_4 may be optional, depending upon the actual design considerations.

The major difference between the phase-rotated harmonic-rejection modulators 700 and 600 is that the phase-rotated harmonic-rejection modulator 700 employs the mixing circuit 504 that receives LO signals LOIP, LOIN, LOQP, LOQN and associated phase-rotated LO signals LOIP_θ, LOIN_θ, LOQP_θ, LOQN_θ. The major difference between the phase-rotated harmonic-rejection modulators 700 and 500 is that the phase-rotated harmonic-rejection modulator 700 employs the baseband signal source 602 that generates and outputs baseband signals BBIP, BBIN, BBQP, BBQN and associated phase-rotated baseband signals BBIP_φ, BBIN_φ, BBQP_φ, BBQN_φ.

In this embodiment, the proposed harmonic-rejection mixer apparatuses 400 shown in FIG. 4 are implemented in the phase-rotated harmonic-rejection modulator 700. When the input signal $S_{IN}$ (B, 0°) is the current signal of the baseband signal BBIP, the phase-rotated input signal $S_{IN}$ (B, 0°+φ) is the current signal of the baseband signal BBIP_φ, the mixer 406 is the mixer 505_1, the mixer 408 is the mixer 505_3, the local oscillator signal LO (A, 0°) is the LO signal LOIP, and the phase-rotated local oscillator signal LO (A, 0°+θ) is the LO signal LOIP_θ. When the input signal $S_{IN}$ (B, 0°) is the current signal of the baseband signal BBIN, the phase-rotated input signal $S_{IN}$ (B, 0°+φ) is the current signal of the baseband signal BBIN_φ, the mixer 406 is the mixer 505_1, the mixer 408 is the mixer 505_3, the local oscillator signal LO (A, 0°) is the LO signal LOIN, and the phase-rotated local oscillator signal LO (A, 0°+θ) is the LO signal LOIN_θ. When the input signal $S_{IN}$ (B, 0°) is the current signal of the baseband signal BBQP, the phase-rotated input signal $S_{IN}$ (B, 0°+φ) is the current signal of the baseband signal BBQP_φ, the mixer 406 is the mixer 505_2, the mixer 408 is the mixer 505_4, the local oscillator signal LO (A, 0°) is the LO signal LOQP, and the phase-rotated local oscillator signal LO (A, 0°+θ) is the LO signal LOQP_θ. When the input signal $S_{IN}$ (B, 0°) is the current signal of the baseband signal BBQN, the phase-rotated input signal $S_{IN}$ (B, 0°+φ) is the current signal of the baseband signal BBQN_φ, the mixer 406 is the mixer 505_2, the mixer 408 is the mixer 505_4, the local oscillator signal LO (A, 0°) is the LO signal LOQN, and the phase-rotated local oscillator signal LO (A, 0°+θ) is the LO signal LOQN_θ.

When the additional stages (e.g., amplifiers) 506_1-506_4 are implemented in the phase-rotated harmonic-rejection modulator 700, outputs of the mixers 505_1-505_4 may be processed by the additional stages (e.g., amplifiers) 506_1-506_4 and then combined by the combining circuit 508 to generate a harmonic-rejected RF output signal $RF_{OUT}$. However, when the additional stages (e.g., amplifiers) 506_1-506_4 are omitted from the phase-rotated harmonic-rejection modulator 700, outputs of the mixers 505_1-505_4 may be directly combined by the combining circuit 508 to generate the harmonic-rejected RF output signal.

Figure 8:
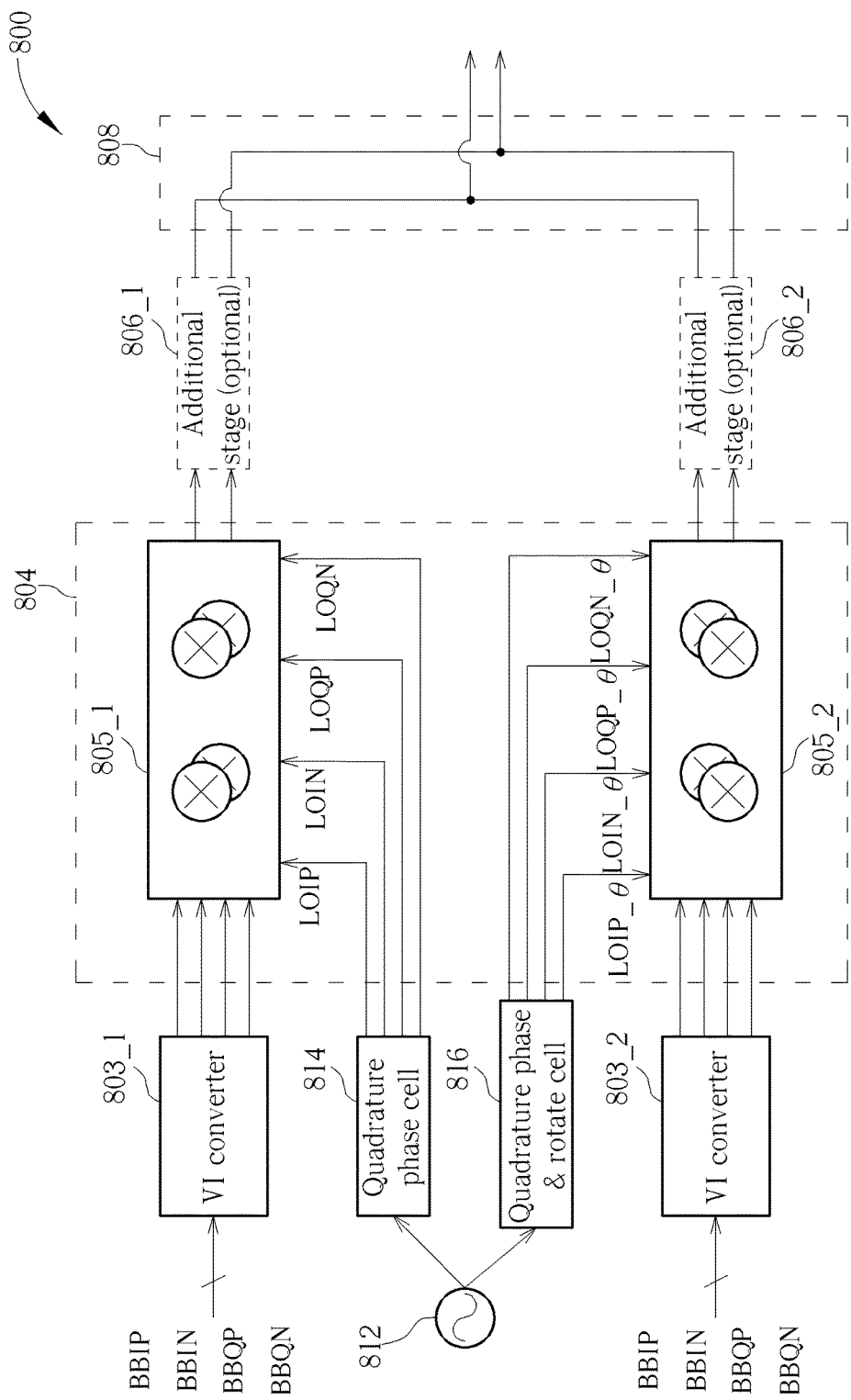
FIG. 8 is a diagram illustrating a fifth phase-rotated harmonic-rejection modulator according to an embodiment of the present invention.

In practice, each of mixing circuits 504 and 604 may be implemented using quadrature mixers. Taking the mixing circuit 504 for example, two quadrature mixers, each receiving four input signals and four LO signals, may be used. FIG. 8 is a diagram illustrating a fifth phase-rotated harmonic-rejection modulator according to an embodiment of the present invention. The major difference between the phase-rotated harmonic-rejection modulators 500 and 800 is that the phase-rotated harmonic-rejection modulator 800 uses two quadrature mixers 805_1, 805_2 to realize the mixing circuit 804. As shown in FIG. 8, the phase-rotated harmonic-rejection modulator 800 includes a voltage-to-current converter (VI converter) 803_1 configured to perform voltage-to-current conversion upon the baseband signals BBIP, BBIN, BBQP, BBQN that are voltage signals output from a baseband signal source (e.g., 502), and further includes a voltage-to-current converter 803_2 configured to perform voltage-to-current conversion upon the baseband signals BBIP, BBIN, BBQP, BBQN that are voltage signals output from the baseband signal source (e.g., 502). A reference clock signal generated from a reference clock source 812 is processed by following circuits (e.g., quadrature phase cell 814 and quadrature phase & rotate cell 816), such that the quadrature phase cell 814 generates the LO signals LOIP, LOIN, LOQP, LOQN to the quadrature mixer 805_1, and the quadrature phase & rotate cell 816 generates the phase-rotated LO signals LOIP_θ, LOIN_θ, LOQP_θ, LOQN_θ to the quadrature mixer 805_2.

When the additional stages (e.g., amplifiers) 806_1, 806_2 are implemented in the phase-rotated harmonic-rejection modulator 800, outputs of the quadrature mixers 805_1, 805_2 may be processed by the additional stages (e.g., amplifiers) 806_1, 806_2 and then combined by the combining circuit 808 to generate a harmonic-rejected RF output signal $RF_{OUT}$. However, when the additional stages (e.g., amplifiers) 806_1, 806_2 are omitted from the phase-rotated harmonic-rejection modulator 800, outputs of the quadrature mixers 805_1, 805_2 may be directly combined by the combining circuit 808 to generate the harmonic-rejected RF output signal $RF_{OUT}$.

Similarly, each of the phase-rotated harmonic-rejection modulator 600 shown in FIG. 6 and the phase-rotated harmonic-rejection modulator 700 shown in FIG. 7 may be modified to employ two quadrature mixers as illustrated in FIG. 8 to realize its mixing circuit. For example, when the baseband signals BBIP, BBIN, BBQP, BBQN received by the voltage-converter 803_2 are replaced by phase-rotated baseband signals BBIP_φ, BBIN_φ, BBQP_φ, BBQN_φ, the harmonic rejection function of the resulting modified phase-rotated harmonic-rejection modulator is the same as the harmonic rejection function of the phase-rotated harmonic-rejection modulator 700 shown in FIG. 7. For another example, when the baseband signals BBIP, BBIN, BBQP, BBQN received by the voltage-converter 803_2 are replaced by phase-rotated baseband signals BBIP_ϕ, BBIN_ϕ$^{SM}$, BBQP_ϕ, BBQN_ϕ and the phase-rotated LO signals LOIP_θ, LOIN_θ, LOQP_θ, LOQN_θ received by the quadrature mixer 805_2 are replaced by LO signals LOIP, LOIN, LOQP, LOQN, the harmonic rejection function of the resulting modified phase-rotated harmonic-rejection modulator is the same as the harmonic rejection function of the phase-rotated harmonic-rejection modulator 600 shown in FIG. 6. Since a person skilled in the art can readily understand details of such modifications made to phase-rotated harmonic-rejection modulator 800 after reading above description, further details are omitted here for brevity.

Figure 9:
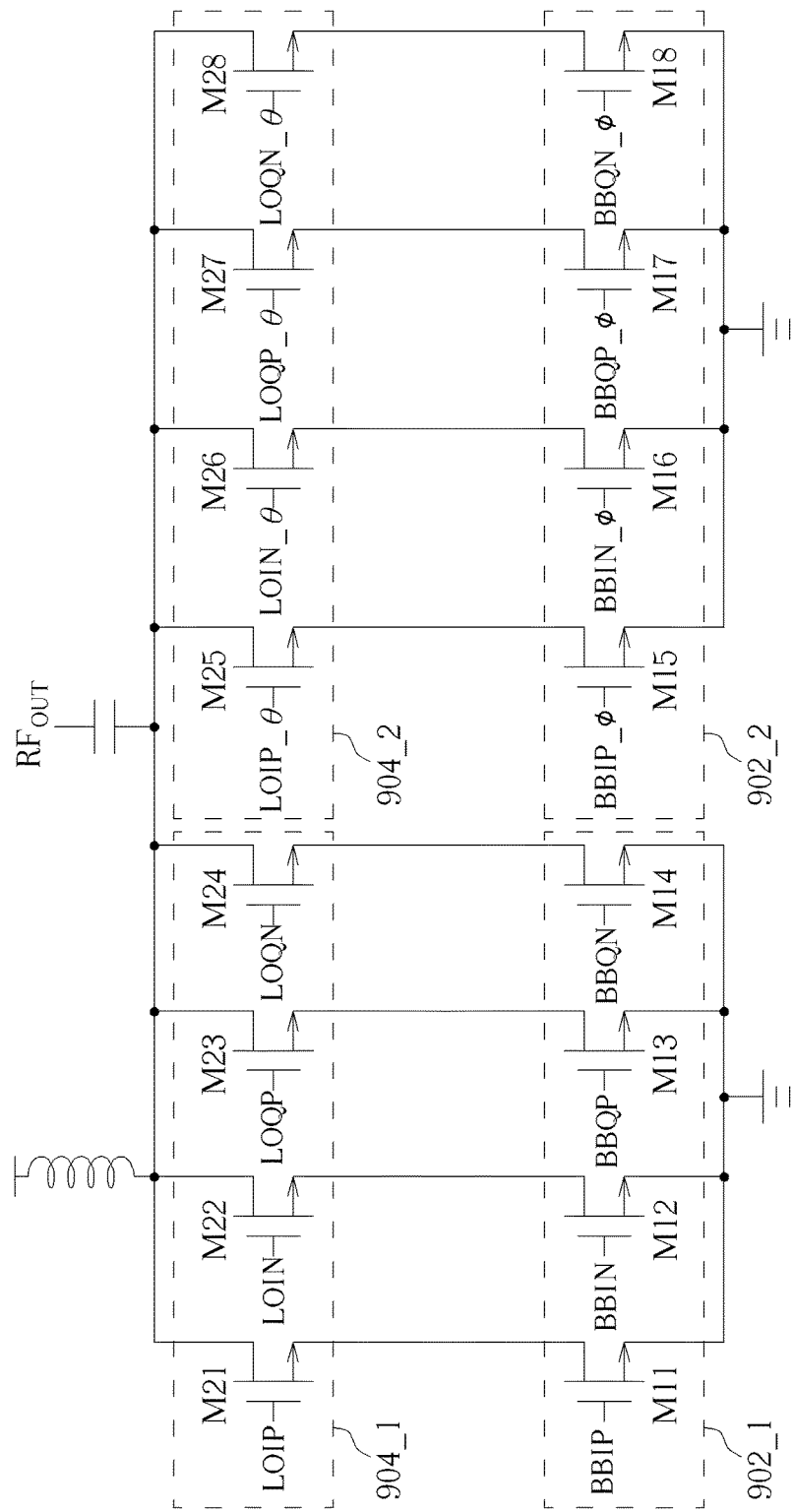
FIG. 9 is a circuit diagram illustrating a portion of a phase-rotated harmonic-rejection modulator according to an embodiment of the present invention.

FIG. 9 is a circuit diagram illustrating a portion of a phase-rotated harmonic-rejection modulator according to an embodiment of the present invention. Assume that the mixing circuit 500 employed by the phase-rotated harmonic-rejection modulator 700 is implemented using two quadrature mixers. As shown in FIG. 9, one common-source amplifier 902_1 is formed by transistors M11-M14, and another common-source amplifier 902_2 is formed by transistors M15-M18. The common-source amplifier 902_1 may serve as one voltage-to-current converter used to perform voltage-to-current conversion upon baseband signals BBIP, BBIN, BBQP, BBQN. The common-source amplifier 902_2 may serve as another voltage-to-current converter used to perform voltage-to-current conversion upon phase-rotated baseband signals BBIP_ϕ, BBIN_ϕ, BBQP_ϕ, BBQN_ϕ. A part of the quadrature mixer 904_1 includes transistors M21-M24 for mixing the current signals of the baseband signals BBIP, BBIN, BBQP, BBQN and the LO signals LOIP, LOIN, LOQP, LOQN. A part of the other quadrature mixer 904_2 includes transistors M25-M28 for mixing the current signals of the phase-rotated baseband signals BBIP_ϕ, BBIN_ϕ, BBQP_ϕ, BBQN_ϕ and the phase-rotated LO signals LOIP_θ, LOIN_θ, LOQP_θ, LOQN_θ. The harmonic-rejected RF output signal RF$_{OUT}$ is generated by combining mixer outputs of the quadrature mixers directly.

With regard to the mixing circuit 804 shown in FIG. 8, the quadrature mixer 805_1 receives current signals of in-phase (I) baseband signals BBIP, BBIN and quadrature (Q) baseband signals BBQP, BBQN, and further receives LO signals LOIP, LOIN, LOQP, LOQN, such that a mixing result of the in-phase (I) baseband signals BBIP, BBIN and a mixing result of the quadrature (Q) baseband signals BBQP, BBQN are combined at the mixer output of the quadrature mixer 805_1. Similarly, the quadrature mixer 805_2 receives current signals of phase-rotated in-phase (I) baseband signals BBIP_ϕ, BBIN_ϕ and phase-rotated quadrature (Q) baseband signals BBQP_ϕ, BBQN_ϕ, and further receives phase-rotated LO signals LOIP_θ, LOIN_θ, LOQP_θ, LOQN_θ, such that a mixing result of the phase-rotated in-phase (I) baseband signals BBIP_ϕ, BBIN_ϕ and a mixing result of the phase-rotated quadrature (Q) baseband signals BBQP_ϕ, BBQN_ϕ are combined at the mixer output of the quadrature mixer 805_2. However, this is for illustrative purposes only, and is not meant to be a limitation of the present invention. Alternatively, one quadrature mixer may perform in-phase (I) baseband signal mixing only, and the other quadrature mixer may perform quadrature (Q) baseband signal mixing only.

Figure 10:
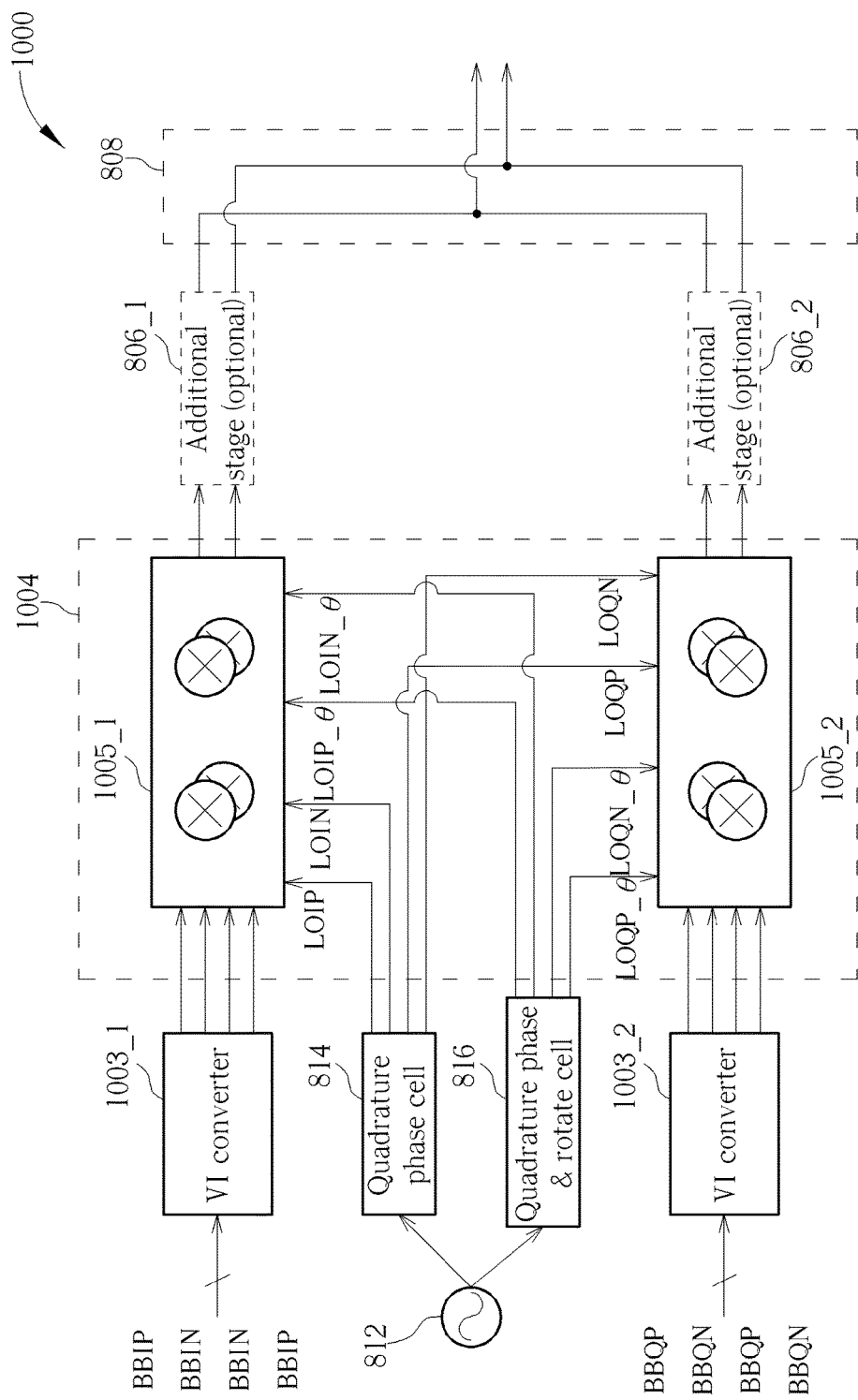
FIG. 10 is a diagram illustrating a sixth phase-rotated harmonic-rejection modulator according to an embodiment of the present invention.

FIG. 10 is a diagram illustrating a sixth phase-rotated harmonic-rejection modulator according to an embodiment of the present invention. The major difference between the phase-rotated harmonic-rejection modulators 800 and 1000 is that the phase-rotated harmonic-rejection modulator 1000 uses an alternative mixing circuit design which has one quadrature mixer 1005_1 for mixing in-phase (I) baseband signals only and has the other quadrature mixer 1005_2 for mixing quadrature (Q) baseband signals only. As shown in FIG. 10, the phase-rotated harmonic-rejection modulator 1000 includes one voltage-to-current converter 1003_1 to perform voltage-to-current conversion upon two identical pairs of in-phase (I) baseband signals BBIP, BBIN that are voltage signals output from a baseband signal source (e.g., 502), and further includes one voltage-to-current converter 1003_2 to perform voltage-to-current conversion upon two identical pairs of quadrature (Q) baseband signals BBQP, BBQN that are voltage signals output from the baseband signal source (e.g., 502). A reference clock signal generated from the reference clock source 812 is processed by following circuits (e.g., quadrature phase cell 814 and quadrature phase & rotate cell 816), such that the quadrature phase cell 814 generates LO signals LOIP, LOIN to the quadrature mixer 1005_1 and generate LO signals LOQP, LOQN to the quadrature mixer 1005_2, and the quadrature phase & rotate cell 816 generates phase-rotated LO signals LOIP_θ, LOIN_θ to the quadrature mixer 1005_1 and generates phase-rotated LO signals LOQP_θ, LOQN_θ to the quadrature mixer 1005_2.

When the additional stages (e.g., amplifiers) 806_1, 806_2 are implemented in the phase-rotated harmonic-rejection modulator 1000, outputs of the quadrature mixers 1005_1, 1005_2 may be processed by the additional stages (e.g., amplifiers) 806_1, 806_2 and then combined by the combining circuit 808 to generate a harmonic-rejected RF output signal RF$_{OUT}$.

Similarly, each of the phase-rotated harmonic-rejection modulator 600 shown in FIG. 6 and the phase-rotated harmonic-rejection modulator 700 shown in FIG. 7 may be modified to employ two quadrature mixers as illustrated in FIG. 10 to realize its mixing circuit. For example, when one pair of in-phase (I) baseband signals BBIP, BBIN received by the voltage-converter 1003_1 is replaced by a pair of phase-rotated in-phase (I) baseband signals BBIP_ϕ, BBIN_ϕ and one pair of quadrature (Q) baseband signals BBQP, BBQN received by the voltage-converter 1003_2 is replaced by a pair of phase-rotated quadrature (Q) baseband signals BBQP_ϕ, BBQN_ϕ, the harmonic rejection function of the resulting modified phase-rotated harmonic-rejection modulator is the same as the harmonic rejection function of the phase-rotated harmonic-rejection modulator 700 shown in FIG. 7. For another example, when one pair of in-phase (I) baseband signals BBIP, BBIN received by the voltage-converter 1003_1 is replaced by a pair of phase-rotated in-phase (I) baseband signals BBIP_ϕ, BBIN_ϕ, one pair of quadrature (Q) baseband signals BBQP, BBQN received by the voltage-converter 1003_2 is replaced by a pair of phase-rotated quadrature (Q) baseband signals BBQP_ϕ, BBQN_ϕ, the phase-rotated LO signals LOIP_θ, LOIN_θ received by the quadrature mixer 1005_1 are replaced by LO signals LOIP, LOIN, and the phase-rotated LO signals LOQP_θ, LOQN_θ received by the quadrature mixer 1005_2 are replaced by LO signals LOQP, LOQN, the harmonic rejection function of the resulting modified phase-rotated harmonic-rejection modulator is the same as the harmonic rejection function of the phase-rotated harmonic-rejection modulator 600 shown in FIG. 6. Since a person skilled in the art can readily understand details of such modifications made to phase-rotated harmonic-rejection modulator 1000 after reading above description, further details are omitted here for brevity.

Figure 11:
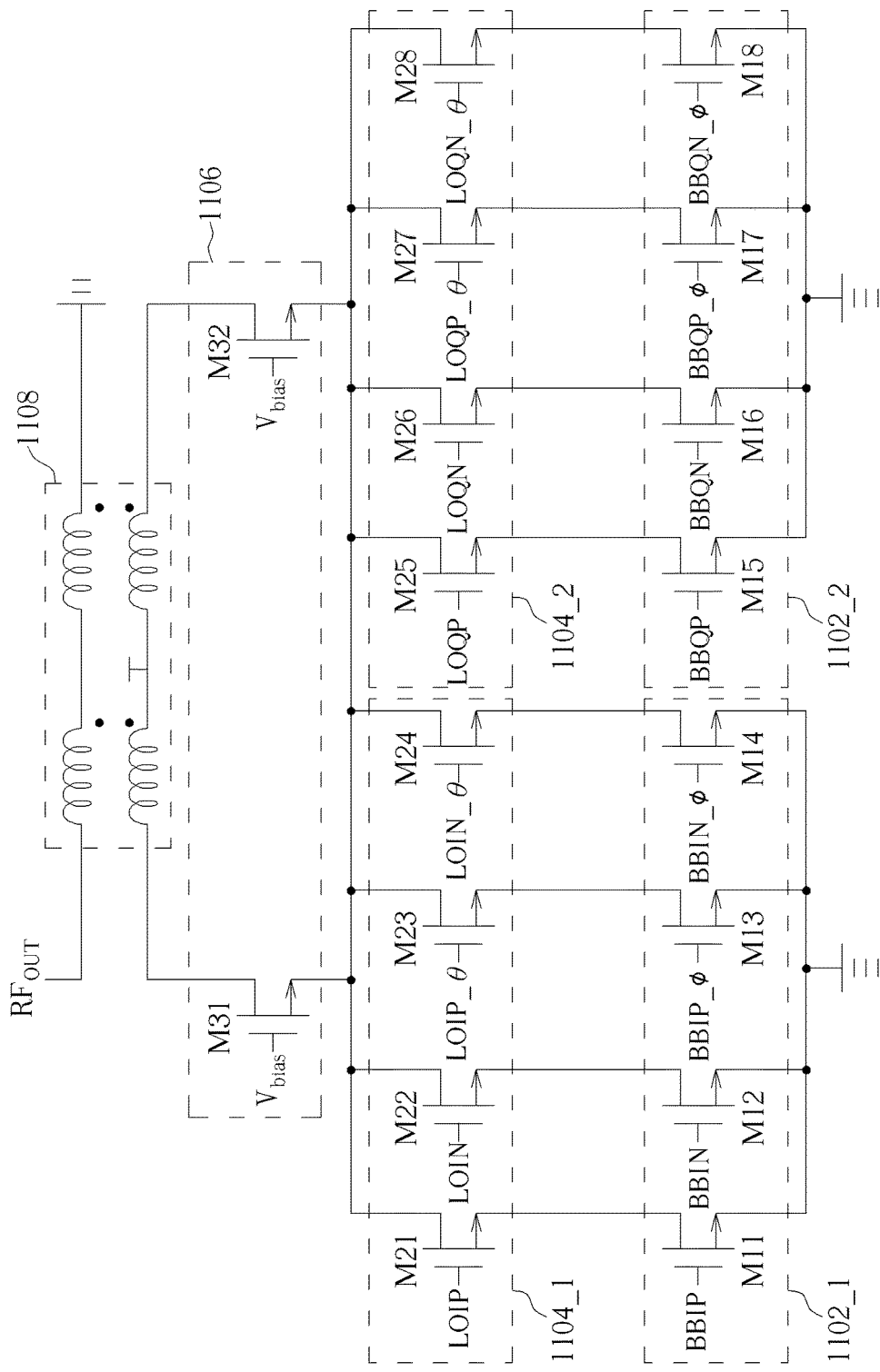
FIG. 11 is a circuit diagram illustrating a portion of another phase-rotated harmonic-rejection modulator according to an embodiment of the present invention.

FIG. 11 is a circuit diagram illustrating a portion of another phase-rotated harmonic-rejection modulator according to an embodiment of the present invention. Assume that the mixing circuit 500 employed by the phase-rotated harmonic-rejection modulator 700 is implemented using two quadrature mixers, one for mixing in-phase (I) baseband signals only and the other for mixing quadrature (Q) baseband signals only. As shown in FIG. 11, one common-source amplifier 1102_1 is formed by transistors M11-M14, and another common-source amplifier 1102_2 is formed by transistors M15-M18. The common-source amplifier 1102_1 may serve as a voltage-to-current converter used to perform voltage-to-current conversion upon baseband signals BBIP, BBIN and phase-rotated baseband signals BBIP_φ, BBIN_φ. The common-source amplifier 1102_2 may serve as a voltage-to-current converter used to perform voltage-to-current conversion upon baseband signals BBQP, BBQN and phase-rotated baseband signals BBQP_φ, BBQN_φ. A part of the quadrature mixer 1104_1 includes transistors M21-M24 for mixing the current signals of the baseband signals BBIP, BBIN, BBIP_φ, BBIN_φ and the LO signals LOIP, LOIN, LOIP_θ, LOIN_θ. A part of the quadrature mixer 1104_2 includes transistors M25-M28 for mixing the current signals of the baseband signals BBQP, BBQN, BBQP_φ, BBQN_φ and the LO signals LOQP, LOQN, LOQP_θ, LOQN_θ.

A common-gate amplifier 1106 is formed by transistors M31 and M32 each biased by the same bias voltage $V_{bias}$. The common-gate amplifier 1106 may act an additional stage for processing mixer outputs of the quadrature mixers 1104_1 and 1104_2. The amplified mixer outputs of the quadrature mixers 1104_1 and 1104_2 are combined through the transform. 1108 that acts as the combining circuit. Hence, the harmonic-rejected RF output signal $RF_{OUT}$ is generated from the transformer 1108.

Moreover, any of the proposed harmonic-rejection mixer designs shown in FIGS. 2-4 may be employed by a demodulator of a receiver. For example, any of the proposed harmonic-rejection mixer designs shown in FIGS. 2-4 may be used to down-convert a radio-frequency signal to a baseband signal in a direct-conversion receiver.

Figure 12:
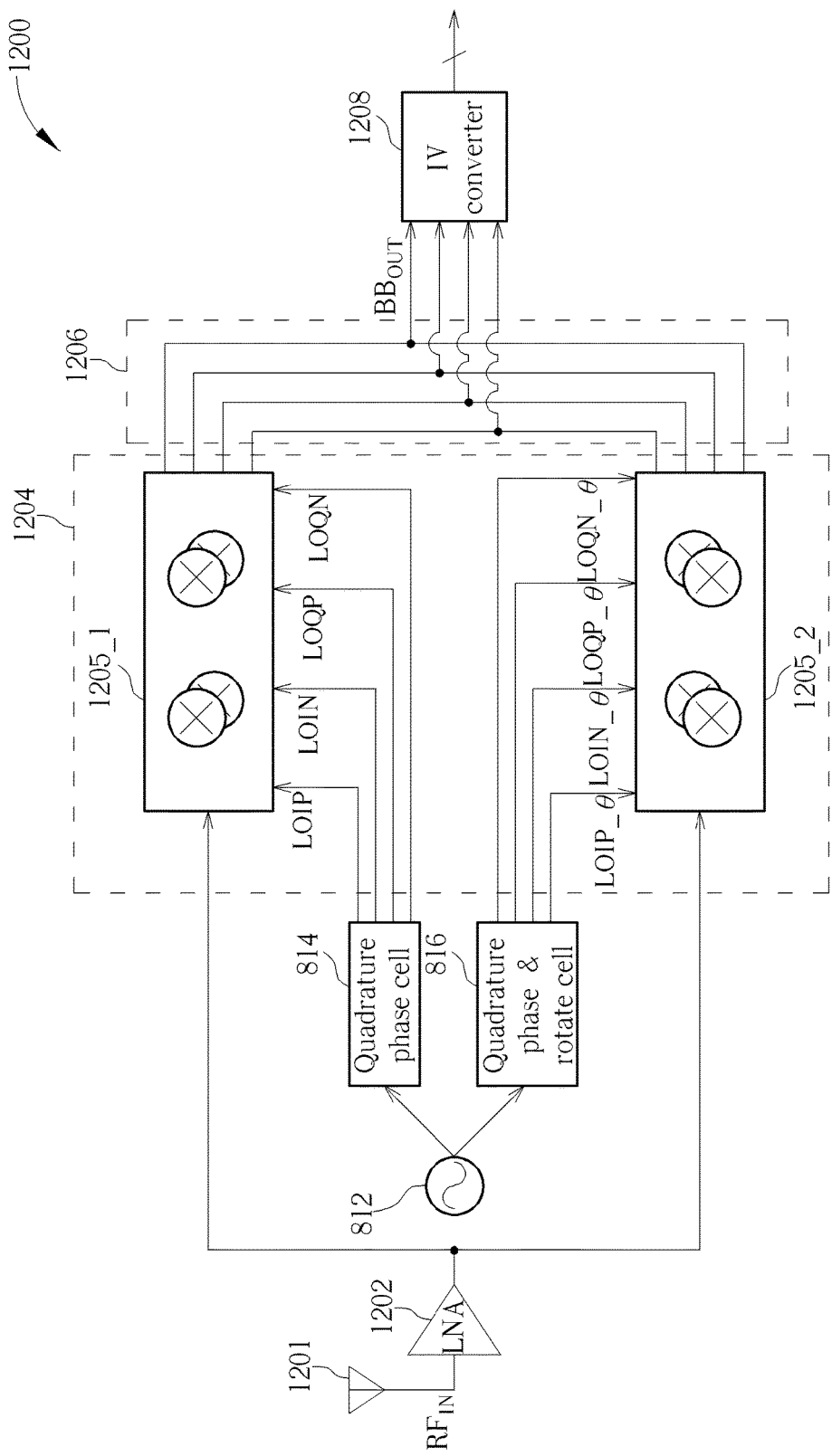
FIG. 12 is a diagram illustrating a first phase-rotated harmonic-rejection demodulator according to an embodiment of the present invention.

FIG. 12 is a diagram illustrating a first phase-rotated harmonic-rejection demodulator according to an embodiment of the present invention. The proposed harmonic-rejection mixer apparatuses 200 shown in FIG. 2 are implemented in the phase-rotated harmonic-rejection demodulator 1200. In this embodiment, the phase-rotated harmonic-rejection demodulator 1200 includes a low-noise amplifier (LNA) 1202, a mixing circuit 1204, a combining circuit 1206, a current-to-voltage converter (IV converter) 1208, a reference clock source 812 and a plurality of processing circuits (e.g., quadrature phase cell 814 and quadrature phase & rotate cell 816). In this embodiment, the mixing circuit 1204 is implemented using two quadrature mixers 1205_1 and 1205_2. However, this is for illustrative purposes only, and is not meant to be a limitation of the present invention.

The RF signal $RF_{IN}$ is received by an antenna 1202, and the received RF signal $RF_{IN}$ is amplified by the LNA 1202. Since the above-mentioned signal combination needed for harmonic cancellation is performed by current (waveform) combination and the output of the antenna 1201 is a voltage signal, a voltage-to-current converter is needed. In this embodiment, the LNA 1202 is further configured to act as a voltage-to-current converter. In this way, the combining circuit 1206 can perform current combination to do vector-sum for harmonic cancellation. The same current signal converted from the RF signal is fed into each of the quadrature mixers 1205_1 and 1205_2. More specifically, four input signal ports of each quadrature mixer 1205_1, 1205_2 are configured to receive the same current signal converted from the RF signal. Hence, input signals of the quadrature mixers 1205_1 and 1205_2 have the same peak amplitude/magnitude.

A reference clock signal generated from the reference clock source 812 is processed by following circuits (e.g., quadrature phase cell 814 and quadrature phase & rotate cell 816), such that the quadrature phase cell 814 generates LO signals LOIP, LOIN, LOQP, LOQN to the quadrature mixer 1205_1, and the quadrature phase & rotate cell 816 generates phase-rotated LO signals LOIP_θ, LOIN_θ, LOQP_θ, LOQN_θ to the quadrature mixer 1205_2. In this embodiment, the LO signals LOIP, LOIN, LOQP, LOQN, LOIP_θ, LOIN_θ, LOQP_θ, LOQN_θ have the same peak amplitude/magnitude but different phases. Further, the LO signals LOIP, LOIN, LOQP, LOQN, LOIP_θ, LOIN_θ, LOQP_θ, LOQN_θ may have the same duty cycle.

The mixer outputs of the quadrature mixers 1205_1 and 1205_2 are combined by the combining circuit 1206 to generate a harmonic-rejected baseband output signal $BB_{OUT}$. For example, the harmonic-rejected baseband output signal $BB_{OUT}$ may include a pair of differential in-phase (I) baseband signals BBIP, BBIN and a pair of differential quadrature (Q) baseband signals BBQP, BBQN. Since current combination is performed at the combining circuit 1206, the harmonic-rejected baseband output signal $BB_{OUT}$ is a current signal. The current-to-voltage converter (IV converter) 1208 is configured to perform current-to-voltage conversion upon the harmonic-rejected baseband output signal $BB_{OUT}$ to generate a voltage output (which includes voltage signals of BBIP, BBIN, BBQP, BBQN) to a following voltage-mode baseband signal processing circuit (not shown).

In this embodiment, the proposed harmonic-rejection mixer apparatuses 200 shown in FIG. 2 are implemented in the phase-rotated harmonic-rejection demodulator 1200. Hence, the input signal $S_{IN}$ is the current signal of the RF signal $RF_{IN}$, the mixer 206 is the quadrature mixer 1205_1, and the mixer 208 is the quadrature mixer 1205_2. When the local oscillator signal LO (A, 0°) is the LO signal LOIP, the phase-rotated local oscillator signal LO (A, 0°+θ) is the LO signal LOIP_θ. When the local oscillator signal LO (A, 0°) is the LO signal LOIN, the phase-rotated local oscillator signal LO (A, 0°+θ) is the LO signal LOIN_θ. When the local oscillator signal LO (A, 0°) is the LO signal LOQP, the phase-rotated local oscillator signal LO (A, 0°+θ) is the LO signal LOQP_θ. When the local oscillator signal LO (A, 0°) is the LO signal LOQN, the phase-rotated local oscillator signal LO (A, 0°+θ) is the LO signal LOQN_θ.

Figure 13:
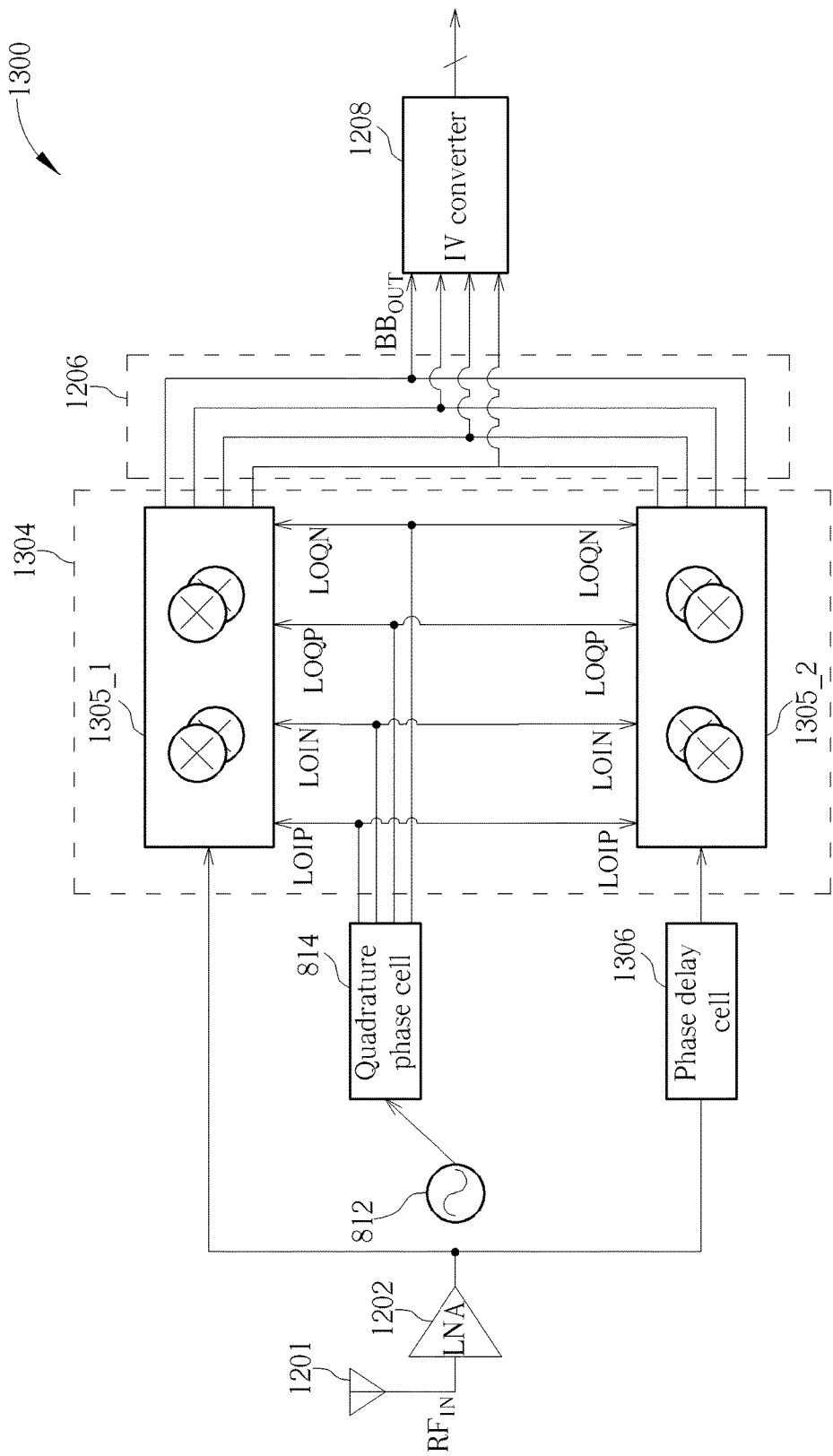
FIG. 13 is a diagram illustrating a second phase-rotated harmonic-rejection demodulator according to an embodiment of the present invention.

FIG. 13 is a diagram illustrating a second phase-rotated harmonic-rejection demodulator according to an embodiment of the present invention. The proposed harmonic-rejection mixer apparatuses 300 shown in FIG. 3 are implemented in the phase-rotated harmonic-rejection demodulator 1300. In this embodiment, the phase-rotated harmonic-rejection demodulator 1300 includes a low-noise amplifier (LNA) 1202, a mixing circuit 1304, a combining circuit 1206, a current-to-voltage converter (IV converter) 1208, a reference clock source 812 and a processing circuit (e.g., quadrature phase cell 814). In this embodiment, the mixing circuit 1304 is implemented using two quadrature mixers 1305_1 and 1305_2. However, this is for illustrative purposes only, and is not meant to be a limitation of the present invention.

As mentioned above, the LNA 1202 is further configured to act as a voltage-to-current converter. In this way, the combining circuit 1206 can perform current combination to do vector-sum for harmonic cancellation. The current signal converted from the RF signal is fed into the quadrature mixer 1305_1. In addition, the same current signal converted from the RF signal is processed by the phase delay cell 1306, such that a current signal of a phase-rotated RF signal is fed into the quadrature mixer 1305_2. More specifically, four input signal ports of the quadrature mixer 1305_1 are configured to receive the same current signal converted from the RF signal, and four input signal ports of the quadrature mixer 1305_2 are configured to receive the same current signal generated from the phase delay cell 1306. Hence, each input signal of the quadrature mixer 1305_1 and each input signal of the quadrature mixer 1305_2 have the same peak amplitude/magnitude but different phases.

A reference clock signal generated from the reference clock source 812 is processed by the quadrature phase cell 814. In this embodiment, the quadrature phase cell 814 generates LO signals LOIP, LOIN, LOQP, LOQN to each of the quadrature mixers 1305_1 and 1305_2, wherein the LO signals LOIP, LOIN, LOQP, LOQN have the same peak amplitude/magnitude but different phases. Further, the LO signals LOIP, LOIN, LOQP, LOQN may have the same duty cycle.

The mixer outputs of the quadrature mixers 1305_1 and 1305_2 are combined by the combining circuit 1206 to generate a harmonic-rejected baseband output signal $BB_{OUT}$. For example, the harmonic-rejected baseband output signal $BB_{OUT}$ may include a pair of differential in-phase (I) baseband signals BBIP, BBIN and a pair of differential quadrature (Q) baseband signals BBQP, BBQN. Since current combination is performed at the combining circuit 1206, the harmonic-rejected baseband output signal $BB_{OUT}$ is a current signal. The current-to-voltage converter (IV converter) 1208 is configured to perform current-to-voltage conversion upon the harmonic-rejected baseband output signal $BB_{OUT}$ to generate a voltage output (which includes voltage signals of BBIP, BBIN, BBQP, BBQN) to a following voltage-mode baseband signal processing circuit (not shown).

In this embodiment, the proposed harmonic-rejection mixer apparatuses 300 shown in FIG. 3 are implemented in the phase-rotated harmonic-rejection demodulator 1200. Hence, the input signal $S_{IN}$ (B, 0°) is the current signal of the RF signal $RF_{IN}$, the phase-rotated input signal $S_{IN}$ (B, 0°+φ) is the current signal of the phase-rotated RF signal $RF_{IN}$ (i.e., the current signal generated from the phase delay cell 1306), the mixer 306 is the quadrature mixer 1305_1, the mixer 308 is the quadrature mixer 1305_2, and the local oscillator signal LO is any of the LO signals LOIP, LOIN, LOQP, LOQN.

Figure 14:
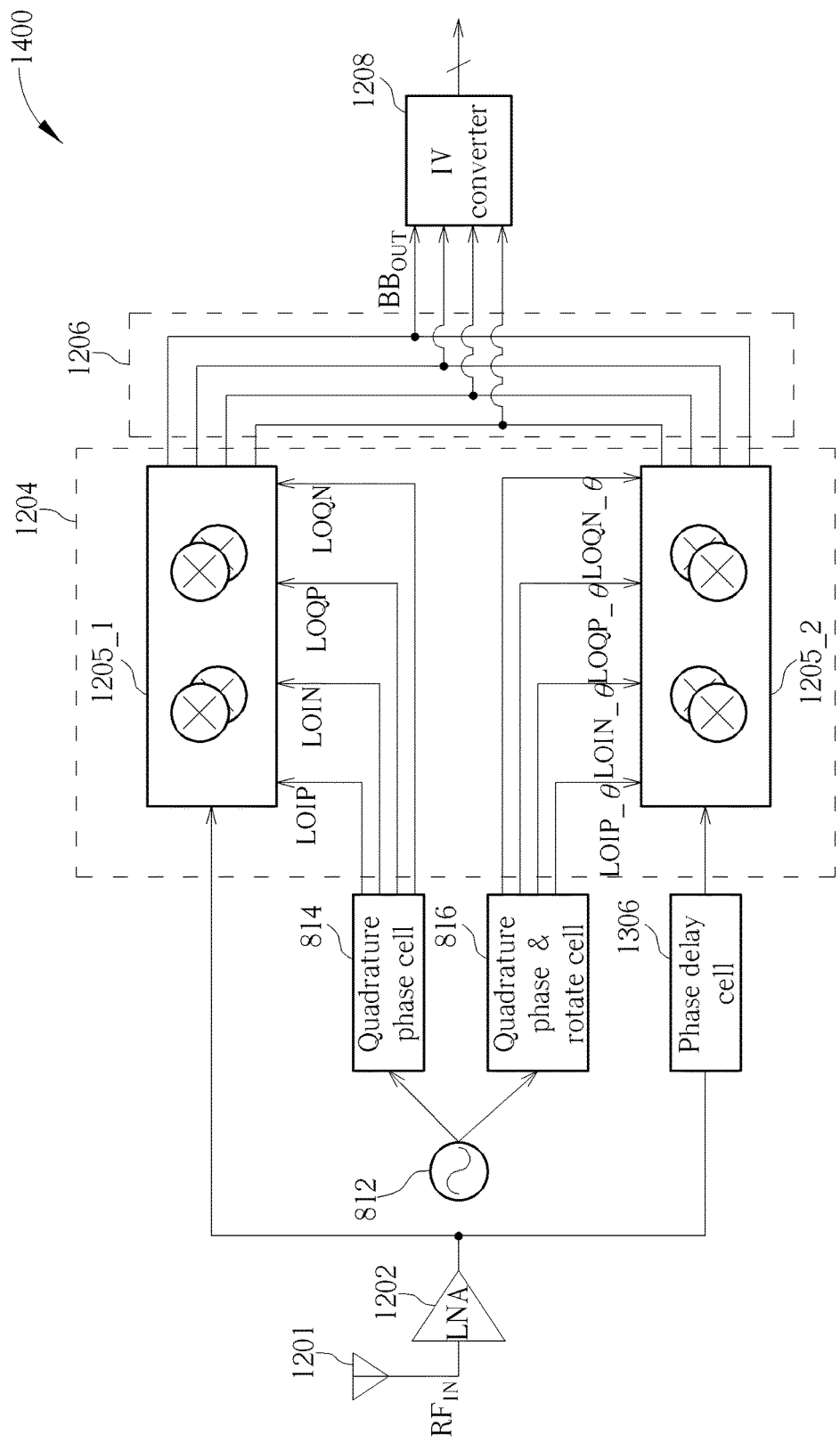
FIG. 14 is a diagram illustrating a third phase-rotated harmonic-rejection demodulator according to an embodiment of the present invention.

FIG. 14 is a diagram illustrating a third phase-rotated harmonic-rejection demodulator according to an embodiment of the present invention. In this embodiment, the phase-rotated harmonic-rejection demodulator 1400 includes a low-noise amplifier (LNA) 1202, a mixing circuit 1204, a combining circuit 1206, a current-to-voltage converter (IV converter) 1208, a reference clock source 812 and a plurality of processing circuits (e.g., phase delay cell 1306, quadrature phase cell 814 and quadrature phase & rotate cell 816). The proposed harmonic-rejection mixer apparatuses 400 shown in FIG. 4 are implemented in the phase-rotated harmonic-rejection demodulator 1400. Hence, the input signal $S_{IN}$ (B, 0°) is the current signal of the RF signal $RF_{IN}$, the phase-rotated input signal $S_{IN}$ (B, 0°+φ) is the current signal of the phase-rotated RF signal (i.e., the current signal generated from the phase delay cell 1306), the mixer 406 is the quadrature mixer 1205_1, and the mixer 408 is the quadrature mixer 1205_2. When the local oscillator signal LO (A, 0°) is the LO signal LOIP, the phase-rotated local oscillator signal LO (A, 0°+θ) is the LO signal LOIP_θ. When the local oscillator signal LO (A, 0°) is the LO signal LOIN, the phase-rotated local oscillator signal LO (A, 0°+θ) is the LO signal LOIN_θ. When the local oscillator signal LO (A, 0°) is the LO signal LOQP, the phase-rotated local oscillator signal LO (A, 0°+θ) is the LO signal LOQP_θ. When the local oscillator signal LO (A, 0°) is the LO signal LOQN, the phase-rotated local oscillator signal LO (A, 0°+θ) is the LO signal LOQN_θ.

As mentioned above, the local oscillator signal (e.g., LO (A, 0°)) and the phase-rotated local oscillator signal (e.g., LO (A, 0°+θ)) do not need to have an irrational amplitude/magnitude ratio; and the input signal (e.g., $S_{IN}$ (B, 0°)) and the phase-rotated input signal (e.g., $S_{IN}$ (B, 0°+φ)) do not need to have an irrational amplitude/magnitude ratio. The same mixer hardware can be reused when input signals and/or LO signals of the mixer hardware are adjusted. In this way, the proposed harmonic-rejection mixer apparatus possesses good reconfigurablity. For example, when the phase rotation θ of the LO signal is switched off, the proposed harmonic-rejection mixer apparatus 200 is reconfigured to a conventional mixer apparatus. Hence, the proposed harmonic-rejection modulator 500 can be reconfigured to a conventional modulator, and the proposed harmonic-rejection demodulator 1200 can be reconfigured to a conventional demodulator. For another example, when the phase rotation φ of the input signal (e.g., a baseband signal or a radio-frequency signal) is switched off, the proposed harmonic-rejection mixer apparatus 300 is reconfigured to a conventional mixer apparatus. Hence, the proposed harmonic-rejection modulator 600 can be reconfigured to a conventional modulator, and the proposed harmonic-rejection demodulator 1300 can be reconfigured to a conventional demodulator. For yet another example, when the phase rotation θ of the LO signal is switched off and the phase rotation φ of the input signal (e.g., a baseband signal or a radio-frequency signal) is switched off, the proposed harmonic-rejection mixer apparatus 400 is reconfigured to a conventional mixer apparatus. Hence, the proposed harmonic-rejection modulator 700 can be reconfigured to a conventional modulator, and the proposed harmonic-rejection demodulator 1400 can be reconfigured to a conventional demodulator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A harmonic-rejection mixer apparatus comprising:
a mixing circuit, configured to receive an input signal, a first local oscillator (LO) signal and a second LO signal, and further configured to mix the input signal and the first LO signal to generate a first output signal and mix the same input signal and the second LO signal to generate a second output signal, wherein the first LO signal and the second LO signal have a same frequency but different phases; and
a combining circuit, configured to combine the first output signal and the second output signal, wherein harmonic rejection is at least achieved by combination of the first output signal and the second output signal;

wherein a phase difference between the first LO signal and the second LO signal is θ, a plurality of $m^{th}$-order harmonics of LO signal are suppressed by the same combination of the first output signal and the second output signal, and θ and m satisfy a following equation:

$$mθ=(2k+1)π,$$

where m comprises different positive integers, and k comprises different non-negative integers.

2. The harmonic-rejection mixer apparatus of claim 1, wherein the first LO signal and the second LO signal have a 60-degree phase difference.

3. The harmonic-rejection mixer apparatus of claim 1, wherein the first LO signal and the second LO signal have a same peak amplitude or a same duty cycle.

4. The harmonic-rejection mixer apparatus of claim 1, further comprising:
 a voltage-to-current converter, configured to receive a baseband signal and perform voltage-to-current conversion upon the baseband signal to generate the input signal.

5. The harmonic-rejection mixer apparatus of claim 1, further comprising:
 a voltage-to-current converter, configured to receive a radio-frequency (RF) signal and perform voltage-to-current conversion upon the RF signal to generate the input signal.

6. A harmonic-rejection mixer apparatus comprising:
 a mixing circuit, configured to receive an input signal, a first local oscillator (LO) signal and a second LO signal, and further configured to mix the input signal and the first LO signal to generate a first output signal and mix the same input signal and the second LO signal to generate a second output signal, wherein the first LO signal and the second LO signal have a same frequency but different phases; and
 a combining circuit, configured to combine the first output signal and the second output signal, wherein harmonic rejection is at least achieved by combination of the first output signal and the second output signal;
 wherein the mixing circuit comprises:
 a first quadrature mixer, configured to receive a pair of out-of-phase input signals, a second pair of out-of-phase input signals, a first pair of out-of-phase LO signals and a second pair of out-of-phase LO signals, and generate a first mixer output to the combining circuit; and
 a second quadrature mixer, configured to receive the pair of out-of-phase input signals, the second pair of out-of-phase input signals, a third pair of out-of-phase LO signals and a fourth pair of out-of-phase LO signals, and generate a second mixer output to the combining circuit;
 wherein the pair of out-of-phase input signals and the second pair of out-of-phase input signals have a 90-degree phase difference, the first pair of out-of-phase LO signals and the second pair of out-of-phase LO signals have a 90-degree phase difference, the third pair of out-of-phase LO signals and the fourth pair of out-of-phase LO signals have a 90-degree phase difference, the input signal is a part of the pair of out-of-phase input signals and the second pair of out-of-phase input signals, the first LO signal is a part of the first pair of out-of-phase LO signals and the second pair of out-of-phase LO signals, and the second LO signal is a part of the third pair of out-of-phase LO signals and the fourth pair of out-of-phase LO signals.

7. A harmonic-rejection mixer apparatus comprising:
 a mixing circuit, configured to receive an input signal, a first local oscillator (LO) signal and a second LO signal, and further configured to mix the input signal and the first LO signal to generate a first output signal and mix the same input signal and the second LO signal to generate a second output signal, wherein the first LO signal and the second LO signal have a same frequency but different phases; and
 a combining circuit, configured to combine the first output signal and the second output signal, wherein harmonic rejection is at least achieved by combination of the first output signal and the second output signal;
 wherein the mixing circuit comprises:
 a first quadrature mixer, configured to receive two identical first pairs of out-of-phase input signals, a first pair of out-of-phase LO signals and a second pair of out-of-phase LO signals, and generate a first mixer output to the combining circuit; and
 a second quadrature mixer, configured to receive two identical second pairs of out-of-phase input signals, a third pair of out-of-phase LO signals and a fourth pair of out-of-phase LO signals, and generate a second mixer output to the combining circuit;
 wherein a first pair of out-of-phase input signal and a second pair of out-of-phase input signals have a 90-degree phase difference, the first pair of out-of-phase LO signals and the third pair of out-of-phase LO signals have a 90-degree phase difference, the second pair of out-of-phase LO signals and the fourth pair of out-of-phase LO signals have a 90-degree phase difference, the input signal is a part of the first pair of out-of-phase input signals and the second pair of out-of-phase input signals, the first LO signal is a part of the first pair of out-of-phase LO signals and the third pair of out-of-phase LO signals, and the second LO signal is a part of the second pair of out-of-phase LO signals and the fourth pair of out-of-phase LO signals.

8. A harmonic-rejection mixer apparatus comprising:
 a mixing circuit, configured to receive a first input signal, a second input signal, and a local oscillator (LO) signal, and further configured to mix the first input signal and the LO signal to generate a first output signal and mix the second input signal and the LO signal to generate a second output signal, wherein the first input signal and the second input signal have a same peak amplitude but different phases; and
 a combining circuit, configured to combine the first output signal and the second output signal, wherein harmonic rejection is at least achieved by combination of the first output signal and the second output signal.

9. The harmonic-rejection mixer apparatus of claim 8, wherein the first input signal and the second input signal have a 60-degree phase difference.

10. The harmonic-rejection mixer apparatus of claim 8, further comprising:
 a first voltage-to-current converter, configured to receive a first baseband signal and perform voltage-to-current conversion upon the first baseband signal to generate the first input signal; and
 a first voltage-to-current converter, configured to receive a second baseband signal and perform voltage-to-current conversion upon the second baseband signal to generate the second input signal.

11. The harmonic-rejection mixer apparatus of claim 8, further comprising:
- a voltage-to-current converter, configured to receive a radio-frequency (RF) signal and perform voltage-to-current conversion upon the RF signal to generate the first input signal; and
- a phase delay circuit, configured to delay the first input signal to generate the second input signal.

12. The harmonic-rejection mixer apparatus of claim 8, wherein the mixing circuit comprises:
- a first quadrature mixer, configured to receive a first pair of out-of-phase input signals, a second pair of out-of-phase input signals, a first pair of out-of-phase LO signals and a second pair of out-of-phase LO signals, and generate a first mixer output to the combining circuit; and
- a second quadrature mixer, configured to receive a third pair of out-of-phase input signals, a fourth pair of out-of-phase input signals, the first pair of out-of-phase LO signals and the second pair of out-of-phase LO signals, and generate a second mixer output to the combining circuit;
- wherein the first pair of out-of-phase input signals and the second pair of out-of-phase input signals have a 90-degree phase difference, the third pair of out-of-phase input signals and the fourth pair of out-of-phase input signals have a 90-degree phase difference, the first pair of out-of-phase LO signals and the second pair of out-of-phase LO signals have a 90-degree phase difference, the first input signal is a part of the first pair of out-of-phase input signals and the second pair of out-of-phase input signals, the second input signal is a part of the third pair of out-of-phase input signals and the fourth pair of out-of-phase input signals, and the LO signal is a part of the first pair of out-of-phase LO signals and the second pair of out-of-phase LO signals.

13. The harmonic-rejection mixer apparatus of claim 8, wherein the mixing circuit comprises:
- a first quadrature mixer, configured to receive a first pair of out-of-phase input signals, a second pair of out-of-phase input signals, a first pair of out-of-phase LO signals and a second pair of out-of-phase LO signals, and generate a first mixer output to the combining circuit; and
- a second quadrature mixer, configured to receive a third pair of out-of-phase input signals, a fourth pair of out-of-phase input signals, the first pair of out-of-phase LO signals and the second pair of out-of-phase LO signals, and generate a second mixer output to the combining circuit;
- wherein the first pair of out-of-phase input signals and the third pair of out-of-phase input signals have a 90-degree phase difference, the second pair of out-of-phase input signals and the fourth pair of out-of-phase input signals have a 90-degree phase difference, the first pair of out-of-phase LO signals and the second pair of out-of-phase LO signals have a 90-degree phase difference, the first input signal is a part of the first pair of out-of-phase input signals and the third pair of out-of-phase input signals, and the second input signal is a part of the second pair of out-of-phase input signals and the fourth pair of out-of-phase input signals.

14. A harmonic-rejection mixer apparatus comprising:
- a mixing circuit, configured to receive a first input signal, a second input signal, a first local oscillator (LO) signal and a second LO signal, and further configured to mix the first input signal and the first LO signal to generate a first output signal and mix the second input signal and the second LO signal to generate a second output signal, wherein the first input signal and the second input signal have a same peak amplitude but different phases, and the first LO signal and the second LO signal have a same frequency but different phases; and
- a combining circuit, configured to combine the first output signal and the second output signal, wherein harmonic rejection is at least achieved by combination of the first output signal and the second output signal.

15. The harmonic-rejection mixer apparatus of claim 14, wherein a phase difference between the first LO signal and the second LO signal is same as a phase difference between the first input signal and the second input signal.

16. The harmonic-rejection mixer apparatus of claim 14, wherein the first LO signal and the second LO signal have a same peak amplitude or a same duty cycle.

17. The harmonic-rejection mixer apparatus of claim 14, further comprising:
- a first voltage-to-current converter, configured to receive a first baseband signal and perform voltage-to-current conversion upon the first baseband signal to generate the first input signal; and,
- a second voltage-to-current converter, configured to receive a second baseband signal and perform voltage-to-current conversion upon the second baseband signal to generate the second input signal.

18. The harmonic-rejection mixer apparatus of claim 14, further comprising:
- a voltage-to-current converter, configured to receive a radio-frequency (RF) signal and perform voltage-to-current conversion upon the RF signal to generate the first input signal; and
- a phase delay circuit, configured to delay the first input signal to generate the second input signal.

19. The harmonic-rejection mixer apparatus of claim 14, wherein the mixing circuit comprises:
- a first quadrature mixer, configured to receive a first pair of out-of-phase input signals, a second pair of out-of-phase input signals, a first pair of out-of-phase LO signals and a second pair of out-of-phase LO signals, and generate a first mixer output to the combining circuit; and
- a second quadrature mixer, configured to receive a third pair of out-of-phase input signals, a fourth pair of out-of-phase input signals, a third pair of out-of-phase LO signals and a fourth pair of out-of-phase LO signals, and generate a second mixer output to the combining circuit;
- wherein the first pair of out-of-phase input signals and the second pair of out-of-phase input signals have a 90-degree phase difference, the third pair of out-of-phase input signals and the fourth pair of out-of-phase input signals have a 90-degree phase difference, the first pair of out-of-phase LO signals and the second pair of out-of-phase LO signals have a 90-degree phase difference, the third pair of out-of-phase LO signals and the fourth pair of out-of-phase LO signals have a 90-degree phase difference, the first input signal is a part of the first pair of out-of-phase input signals and the second pair of out-of-phase input signals, the second input signal is a part of the third pair of out-of-phase input signals and the fourth pair of out-of-phase input signals, the first LO signal is a part of the first pair of out-of-phase LO signals and the second pair of out-of-phase LO signals, and the second LO signal is a part of the third pair of out-of-phase LO signals and the fourth pair of out-of-phase LO signals.

20. The harmonic-rejection mixer apparatus of claim 14, wherein the mixing circuit comprises:
a first quadrature mixer, configured to receive a first pair of out-of-phase input signals, a second pair of out-of-phase input signals, a first pair of out-of-phase LO signals and a second pair of out-of-phase LO signals, and generate a first mixer output to the combining circuit; and
a second quadrature mixer, configured to receive a third pair of out-of-phase input signals, a fourth pair of out-of-phase input signals, a third pair of out-of-phase LO signals and a fourth pair of out-of-phase LO signals, and generate a second mixer output to the combining circuit;
wherein the first pair of out-of-phase input signals and the third pair of out-of-phase input signals have a 90-degree phase difference, the second pair of out-of-phase input signals and the fourth pair of out-of-phase input signals have a 90-degree phase difference, the first pair of out-of-phase LO signals and the third pair of out-of-phase LO signals have a 90-degree phase difference, the second pair of out-of-phase LO signals and the fourth pair of out-of-phase LO signals have a 90-degree phase difference, the first input signal is a part of the first pair of out-of-phase input signals and the third pair of out-of-phase input signals, the second input signal is a part of the second pair of out-of-phase input signals and the fourth pair of out-of-phase input signals, the first LO signal is a part of the first pair of out-of-phase LO signals and the third pair of out-of-phase LO signals, and the second LO signal is a part of the second pair of out-of-phase LO signals and the fourth pair of out-of-phase LO signals.

21. A harmonic-rejection mixer apparatus comprising:
a first transistor, comprising:
a control node, configured to receive a first local oscillator (LO) signal;
a first connection node, configured to receive an input signal; and
a second connection, configured to generate a first output signal to an interconnection node;
a second transistor, comprising:
a control node, configured to receive a second LO signal, wherein the first LO signal and the second LO signal have a same frequency but different phases;
a first connection node, configured to receive the same input signal; and
a second connection node, configured to generate a second output signal to the interconnection node, wherein harmonic rejection is at least achieved by combination of the first output signal and the second output signal at the interconnection node;
wherein a phase difference between the first LO signal and the second LO signal is θ, a plurality of $m^{th}$-order harmonics of LO signal are suppressed by the same combination of the first output signal and the second output signal, and θ and m satisfy a following equation:

$$mθ=(2k+1)π,$$

where m comprises different positive integers, and k comprises different non-negative integers.

22. A harmonic-rejection mixer apparatus comprising:
a first transistor, comprising:
a control node, configured to receive a local oscillator (LO) signal;
a first connection node, configured to receive a first input signal; and
a second connection, configured to generate a first output signal to an interconnection node;
a second transistor, comprising:
a control node, configured to receive the same LO signal;
a first connection node, configured to receive a second input signal, wherein the first input signal and the second input signal have a same peak amplitude but different phases; and
a second connection node, configured to generate a second output signal to the interconnection node, wherein harmonic rejection is at least achieved by combination of the first output signal and the second output signal at the interconnection node.

23. A harmonic-rejection mixer apparatus comprising:
a first transistor, comprising:
a control node, configured to receive a first local oscillator (LO) signal;
a first connection node, configured to receive a first input signal; and
a second connection, configured to generate a first output signal to an interconnection node;
a second transistor, comprising:
a control node, configured to receive a second LO signal, wherein the first LO signal and the second LO signal have a same frequency but different phases;
a first connection node, configured to receive a second input signal, wherein the first input signal and the second input signal have a same peak amplitude but different phases; and
a second connection node, configured to generate a second output signal to the interconnection node, wherein harmonic rejection is at least achieved by combination of the first output signal and the second output signal at the interconnection node.

* * * * *